(12) United States Patent
Sadamatsu et al.

(10) Patent No.: US 10,475,920 B2
(45) Date of Patent: Nov. 12, 2019

(54) SEMICONDUCTOR DEVICE AND SEMICONDUCTOR DEVICE MANUFACTURING METHOD

(71) Applicant: Mitsubishi Electric Corporation, Chiyoda-ku (JP)

(72) Inventors: Koji Sadamatsu, Tokyo (JP); Shiro Hino, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/567,670

(22) PCT Filed: Nov. 6, 2015

(86) PCT No.: PCT/JP2015/081372
§ 371 (c)(1),
(2) Date: Oct. 19, 2017

(87) PCT Pub. No.: WO2016/170706
PCT Pub. Date: Oct. 27, 2016

(65) Prior Publication Data
US 2018/0097103 A1    Apr. 5, 2018

(30) Foreign Application Priority Data

Apr. 22, 2015   (JP) ................. 2015-087252

(51) Int. Cl.
*H01L 29/06* (2006.01)
*H01L 29/16* (2006.01)
(Continued)

(52) U.S. Cl.
CPC ...... *H01L 29/7815* (2013.01); *H01L 29/0649* (2013.01); *H01L 29/1608* (2013.01); *H01L 29/47* (2013.01); *H01L 29/66068* (2013.01)

(58) Field of Classification Search
CPC . H01L 29/7815; H01L 29/1608; H01L 29/47; H01L 29/0649; H01L 29/66068;
(Continued)

(56) References Cited

U.S. PATENT DOCUMENTS 5,289,028 A    2/1994  Clark et al.
7,230,273 B2*  6/2007  Kitabatake ........ H01L 23/49562
                                                  257/76
(Continued)

FOREIGN PATENT DOCUMENTS

JP      5-218311 A   8/1993
JP      6-37320 A    2/1994
(Continued)

OTHER PUBLICATIONS

International Preliminary Report on Patentability and Written Opinion dated Nov. 2, 2017 in PCT/JP2015/081372 (with English translation).

(Continued)

*Primary Examiner* — Natalia A Gondarenko
(74) *Attorney, Agent, or Firm* — Oblon, McClelland, Maier & Neustadt, L.L.P.

(57) ABSTRACT

A drift layer is made of a wide bandgap semiconductor. First well regions are formed on the drift layer. A source region is formed on each of the first well regions. A gate insulating film is formed on the first well regions. A first electrode is in contact with the source regions, and has diode characteristics allowing unipolar conduction to the drift layer between the first well regions. A second well region is formed on the drift layer. A second electrode is in contact with the second well region, and separated from a gate electrode and the first electrode.

14 Claims, 15 Drawing Sheets

(51) Int. Cl.
*H01L 29/47* (2006.01)
*H01L 29/66* (2006.01)
*H01L 29/78* (2006.01)

(58) Field of Classification Search
CPC .......................... H01L 29/66712–66734; H01L 29/7802–7815; H01L 29/66666; H01L 29/7827–7828; H01L 29/78642; H01L 27/085–098; H01L 27/0922; H01L 27/105; H01L 27/11526; H01L 27/11546; H01L 21/8232–8239; H01L 21/823462; H01L 21/823842; H01L 21/823857; H01L 21/823487
USPC ......... 257/48, 133, 135, 139, 142, 328, 329, 257/330, 394, 398, 399, 400, 409, 652, 257/630
See application file for complete search history.

(56) References Cited

U.S. PATENT DOCUMENTS

| | | | | |
|---|---|---|---|---|
| 8,003,991 | B2* | 8/2011 | Yatsuo | H01L 21/8213 257/328 |
| 8,582,334 | B2 | 11/2013 | Hayashi et al. | |
| 9,577,086 | B2 | 2/2017 | Hino et al. | |
| 2009/0108303 | A1* | 4/2009 | Pfirsch | H01L 29/0634 257/287 |
| 2012/0133388 | A1* | 5/2012 | Bernoux | H01L 29/7808 324/762.01 |
| 2012/0298994 | A1* | 11/2012 | Sawada | H01L 29/42372 257/48 |
| 2013/0020587 | A1* | 1/2013 | Hino | H01L 29/1095 257/77 |
| 2013/0021831 | A1* | 1/2013 | Kitabatake | H02M 7/5387 363/131 |
| 2014/0225114 | A1* | 8/2014 | Furukawa | H01L 29/66068 257/48 |

FOREIGN PATENT DOCUMENTS

| | | | |
|---|---|---|---|
| JP | 2003-17701 A | 1/2003 | |
| JP | 2004-289023 A1 | 10/2004 | |
| JP | 2006-216596 A | 8/2006 | |
| JP | 2007-266549 A | 10/2007 | |
| JP | WO 2013042406 A1 * | 3/2013 | ....... H01L 29/66068 |
| JP | 2014-175431 A | 9/2014 | |
| JP | 2015-35618 A | 2/2015 | |
| WO | WO 2013/051170 A1 | 4/2013 | |
| WO | WO 2014/162969 A1 | 10/2014 | |

OTHER PUBLICATIONS

International Search Report dated Feb. 2, 2016 in PCT/JP2015/081372 filed Nov. 6, 2015.
Bin Chen, et al., "Electrical and Optical Properties of Stacking Faults in 4H—SiC Devices" Journal of Electronic Materials, vol. 39, No. 6, 2010, pp. 684-687.
S. Ha, et al., "Driving Force of Stacking-Fault Formation in SiC p-i-n Diodes" Physical Review Letters, vol. 92, No. 17, 2004, pp. 175504-1-175504-4.
Anant Agarwal, et al., "A New Degradation Mechanism in High-Voltage SiC Power MOSFETs" IEEE Electron Device Letters, vol. 28, No. 7, Jul. 2007, pp. 587-589.

* cited by examiner

SEMICONDUCTOR DEVICE AND SEMICONDUCTOR DEVICE MANUFACTURING METHOD

TECHNICAL FIELD

The present invention relates to a semiconductor device and a method for manufacturing the same, and particularly to a semiconductor device using a wide bandgap semiconductor and a method for manufacturing the same.

BACKGROUND ART

It is known that continuous application of a forward current to a p-n diode using silicon carbide (SiC) increases a forward bias (for example, see Non-Patent Document 1 below). This occurs because recombined energy obtained when minority carriers injected through the p-n diode are recombined with majority carriers causes the triangular stacking faults (may also be referred to as "Shockley-type stacking faults"), which are plane defects, to extend into crystals from basal plane dislocations, etc. in a silicon carbide substrate as an origin (for example, see Non-Patent Document 2 below). It can be considered that increase in the forward bias of the p-n diode occurs because the triangular stacking faults obstruct the current flow. Such increase in the forward bias may degrade the reliability.

There is a report that such forward bias shift similarly occurs in a metal oxide semiconductor field effect transistor (MOSFET) using silicon carbide (for example, see Non-Patent Document 3 below). In the MOSFET structure, a parasitic p-n diode (body diode) is interposed between a source and a drain, and application of a forward current to this body diode degrades the reliability similarly as the p-n diode. When a Schottky barrier diode chip functioning as a free-wheeling diode and having a low forward bias is connected in parallel with a MOSFET chip, this problem will be mitigated. However, as pointed out by Patent Document 1, the external installation of a diode increases the number of parts included in a device. If the body diode in the MOSFET serves all or a part of the functions of the free-wheeling diode, the reliability of the MOSFET chip may also be degraded as mentioned above.

Examples of a method for addressing this problem include a stress test for applying a forward current to a p-n diode structure for a long time and measuring change in the forward bias before and after the application of the current as mentioned in, for example, Patent Document 2. Rejecting (screening) elements whose degradation is significant in the stress test from products can ensure higher reliability. An amount of variations in the forward bias that is paid attention to in determining the presence or absence of degradation is directly proportional to an area of stacking faults. The expansion rate of this area is almost directly proportional to an integrated quantity of minority carriers injected through a p-n diode. This integrated quantity depends on the magnitude of a current and a time during which the current is flowing. An excess current to finish the test for a short period of time may damage a chip or test equipment through excess generation of heat in a diode element. Conversely, reduction in current requires a longer time to test, which consequently causes practical problems including increase in the chip cost.

On the other hand, semiconductor chips functioning as unipolar transistors such as MOSFETs can include a diode that allows a current to pass only by majority carriers, that is, a unipolar diode as a free-wheeling diode to replace the p-n diode that may degrade the reliability as mentioned above. For example, in Patent Documents 3 and 4, a unit cell of a MOSFET incorporates a Schottky barrier diode (SBD) as a unipolar diode. Inclusion of the unipolar diode having an operating voltage lower than that of a body diode, in a unit cell as an active region of a unipolar transistor can prevent a forward current from flowing through the body diode in the active region in its practical use. Accordingly, degradation in characteristics of the active region can be suppressed.

PRIOR-ART DOCUMENTS

Patent Documents

Patent Document 1: WO2013/051170
Patent Document 2: Japanese Patent Application Laid-Open No. 2004-289023
Patent Document 3: Japanese Patent Application Laid-Open No. 2003-017701
Patent Document 4: WO2014/162969

Non-Patent Documents

Non-Patent Document 1: Journal of ELECTRONIC MATERIALS, Vol. 39, No. 6, pp. 684-687 (2010) "Electrical and Optical Properties of Stacking Faults in 4H-SiC Devices"
Non-Patent Document 2: PHYSICAL REVIEW LETTERS, Vol. 92, No. 17, 175504 (2004) "Driving Force of Stacking-Fault Formation in SiC p-i-n Diodes"
Non-Patent Document 3: IEEE ELECTRON DEVICE LETTERS, Vol. 28, No. 7, pp. 587-589 (2007) "A New Degradation Mechanism in High-Voltage SiC Power MOSFETs"

SUMMARY

Problems to be Solved by the Invention

However, a region other than the active region, in particular, a terminal region around the active region, has a portion where a unipolar diode cannot be disposed in view of its structure or their functions although it has a parasitic diode. If this portion has an origin of the basal plane dislocations, etc., characteristics of the transistor degrade due to the extension of the triangular stacking faults. Specifically, a voltage drop increases with application of a source-drain current. As a result, there is apprehension that thermal runaway exhibited in its practical use may destroy the elements. Thus, even if a unipolar transistor incorporates an SBD, the screening in the stress test is effective. Since the operating voltage of the SBD is set lower than that of a parasitic diode, most of a stress current to be used in a stress test mainly passes through not the parasitic diode required to be tested but the incorporated SBD. The current passing through the incorporated SBD also becomes a cause of Joule heating, which causes the elements to generate heat. Thus, a stress current needs to be reduced to prevent a chip or evaluation equipment from being thermally damaged by the heat generated in the elements. Consequently, the test time is prolonged.

Furthermore, when a larger amount of the stress current flows through the active region, the current also begins to flow through a parasitic p-n diode. Consequently, the stacking faults are formed in the active region, in which the stress test is originally unnecessary. These stacking faults may vary the forward bias of a MOSFET. When chips whose forward bias is out of specification are rejected, the manufacturing yield of the chips decreases.

As described above, the transistors including the unipolar transistors have had a problem with a long time for conducting the stress test for the screening. Furthermore, there has been a problem with larger variations in the transistor characteristics caused by the stress test. Although SiC is well known to form the triangular stacking faults which cause such problems, the other wide bandgap semiconductors may form such faults.

The present invention has been conceived to solve the problems, and has an object of providing a semiconductor device which includes a transistor and a unipolar diode, whose stress test can be conducted in a shorter period of time, and whose transistor characteristics caused by the stress test hardly vary.

Means to Solve the Problems

A semiconductor device according to the present invention includes: a semiconductor substrate having a first conductivity type; a drift layer having the first conductivity type; a plurality of first well regions having a second conductivity type different from the first conductivity type; source regions having the first conductivity type; a gate insulating film; a gate electrode; a first electrode; at least one second well region having the second conductivity type; a second electrode; and a third electrode. The drift layer is formed on the semiconductor substrate, and is made of a wide bandgap semiconductor. The first well regions are formed on the drift layer. The source region is formed on each of the first well regions, and is separated from the drift layer by the first well regions. The gate insulating film is formed on the first well regions. The gate electrode is formed above the gate insulating film. The first electrode is in contact with the source regions, and has diode characteristics allowing unipolar conduction to the drift layer between the first well regions. The second well region is formed on the drift layer. The second electrode is in contact with the second well region and is separated from the gate electrode and the first electrode. The third electrode is electrically connected to the semiconductor substrate.

A method for manufacturing a semiconductor device according to the present invention includes the following processes. A semiconductor substrate having a first conductivity type; a drift layer having the first conductivity type, the drift layer being formed on the semiconductor substrate and made of a wide bandgap semiconductor; a plurality of first well regions being formed on the drift layer and having a second conductivity type different from the first conductivity type; a source region being separated from the drift layer by the first well regions and having the first conductivity type, the source region being formed on each of the first well regions; a gate insulating film formed on the first well regions; a gate electrode formed above the gate insulating film; a first electrode being in contact with the source regions, and having diode characteristics allowing unipolar conduction to the drift layer between the first well regions; at least one second well region being formed on the drift layer and having the second conductivity type; a second electrode being in contact with the second well region and separated from the gate electrode and the first electrode; and a third electrode electrically connected to the semiconductor substrate are formed. A p-n junction between the second well region and the drift layer is forward biased with application of a voltage between the second electrode and the third electrode, the voltage being lower than a voltage between the first electrode and the third electrode.

Effects of the Invention

According to the present invention, the second electrode that is in contact with the second well region placed outside the active region is provided separately from the first electrode that is in contact with the first well regions placed inside the active region. The stress test to forward bias the p-n junction between the second well region and the drift layer using the second electrode can suppress the stress current flowing through the active region. Accordingly, first, an amount of heat generated in the active region during the stress test becomes smaller. Thus, since a higher current can be applied in the stress test, the stress test can be conducted in a shorter period of time. Second, formation of the stacking faults in the active region during the stress test is suppressed. Accordingly, variations in the transistor characteristics caused by the stress test hardly occur. Consequently, the time for the stress test can be shortened, and variations in the transistor characteristics caused by the stress test can be suppressed.

The objects, features, aspects and advantages of the present invention will become more apparent from the following detailed description and the accompanying drawings.

DESCRIPTION OF EMBODIMENTS

Figure 1:
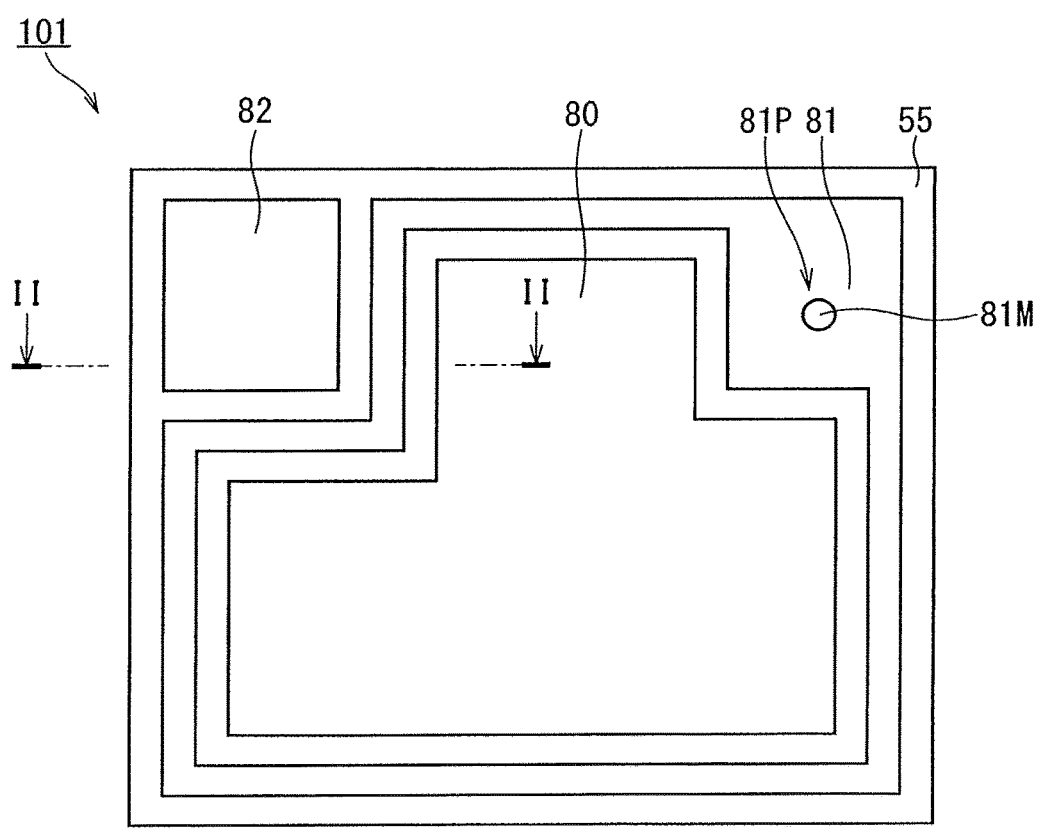
FIG. 1 is a plan view schematically illustrating a structure of a semiconductor device according to Embodiment 1 of the present invention.

Embodiments according to the present invention will be hereafter described based on the drawings. In the entire semiconductor device of the Description, a region in which unit cells are periodically disposed will be referred to as an active region, and the rest of the region will be referred to as a terminal region.

Embodiment 1

(Structure)

A structure of a MOSFET 101 (semiconductor device) according to Embodiment 1 will be described with reference to FIGS. 1 and 2. The MOSFET 101 incorporates an SBD, which will be later described in detail.

The MOSFET 101 includes a substrate 10 (semiconductor substrate) having n-type conductivity (first conductivity type), a semiconductor layer on the substrate 10, a gate insulating film 50, a field insulating film 52, an interlayer insulating film 55, a source electrode 80 (first electrode), a test electrode 81 (second electrode), a gate electrode 82, an ohmic electrode 79, and a drain electrode 85 (third electrode). The semiconductor layer includes a drift layer 20 having n-type conductivity, a plurality of well regions 30 (first well regions) having p-type conductivity (a second conductivity type different from the first conductivity type), a well region 31 (second well region) having p-type conductivity, source regions 40 having n-type conductivity, and a junction termination extension (JTE) region 37 having p-type conductivity.

The substrate 10 is made of, for example, silicon carbide of a 4H polytype. The substrate 10 is preferably higher in impurity concentration than the drift layer 20. One surface (an upper surface in FIG. 2) of the substrate 10 is, for example, a plane inclined approximately 4° with respect to the (0001) plane.

The drain electrode 85 is formed on another surface (a lower surface in FIG. 2) of the substrate 10 through the ohmic electrode 79. The ohmic electrode 79 is in contact with the lower surface of the substrate 10. Accordingly, the drain electrode 85 is electrically ohmic-connected to the substrate 10.

The drift layer 20 is formed on the substrate 10. The drift layer 20 is made of a wide bandgap semiconductor, and is made of silicon carbide with a hexagonal crystal structure according to Embodiment 1. The entire semiconductor layer on the substrate 10 is made of silicon carbide as a wide bandgap semiconductor according to Embodiment 1. In other words, the semiconductor layer is a silicon carbide layer.

The plurality of well regions 30 are disposed in an active region R1, and separated from one another on the drift layer 20. Accordingly, spaced-apart regions 21 or 22 included in the drift layer 20 are provided between the well regions 30 that are adjacent to one another in the semiconductor layer. The spaced-apart regions 21 and 22 are, for example, alternately disposed. The plurality of well regions 30 on the drift layer 20 may be separated from one another in a cross-sectional view of one plane as illustrated FIG. 2, and may be connected to one another in a portion excluded from this cross-sectional view.

The source region 40 is formed on each of the well regions 30 in the surface of the semiconductor layer. The source regions 40 are shallower than the well regions 30, and are separated from the drift layer 20 by the well regions 30. For example, nitrogen (N) is used as a conductivity-type impurity (donor impurity) for imparting n-type conductivity to the source region 40.

The plurality of well regions 30 are disposed in respective unit cells that are periodically disposed in the MOSFET 101.

Thus, the well regions 30 are periodically disposed. Each of the well regions 30 includes a high-concentration region 35 between the source region 40 and the spaced-apart region 22 in the surface of the semiconductor layer. The high-concentration regions 35 have an impurity concentration higher than those of the other regions in the well regions 30. Thus, the high-concentration regions 35 have an electric resistance lower than those of the other regions in the well regions 30.

The well region 31 is disposed in a terminal region R2 around the active region R1, and is separated from the plurality of well regions 30 on the drift layer 20. The width of a spaced-apart region between the well regions 30 and 31 is almost as identical as that of the spaced-apart region 21. The area of the well region 31 is larger than that of each of the well regions 30. The well region 31 protrudes outside (to the right of FIG. 2) from the source electrode 80 in a plan layout. Each of the well regions 31 includes a high-concentration region 36 in the surface of the semiconductor layer. The high-concentration region 36 has an impurity concentration higher than those of the other regions in the well region 31. Thus, the high-concentration region 36 has an electric resistance lower than those of the other regions in the well region 31.

The well region 31 preferably has a concentration profile similar to those of the well regions 30 using a conductivity-type impurity of the same kind. Here, the well regions 30 and 31 can be simultaneously formed. Furthermore, the high-concentration region 36 preferably has a concentration profile similar to those of the high-concentration regions 35 using a conductivity-type impurity of the same kind. Here, the high-concentration regions 35 and 36 can be simultaneously formed. For example, aluminum (Al) is used as the conductivity-type impurity (an acceptor impurity) for imparting p-type conductivity to the well regions 30 and 31.

The JTE region 37 is disposed at the outermost circumference (to the right of FIG. 2) of the well region 31, and connected to the well region 31. The JTE region 37 has an impurity concentration lower than that of the well region 31.

The gate insulating film 50 is formed on the well regions 30, and spreads across each of the well regions 30 between the source region 40 and the spaced-apart region 21. The gate insulating film 50 is preferably made of silicon oxide, and is, for example, a thermally oxidized film.

The gate electrode 82 includes a gate electrode portion 60, and a wiring layer 82w that is in contact with the gate electrode portion 60. The gate electrode portion 60 is formed on the gate insulating film 50, and spreads across each of the well regions 30 through the gate insulating film 50 between the source region 40 and the spaced-apart region 21. With this structure, a portion of each of the well regions 30 facing the gate electrode portion 60 through the gate insulating film 50 between the spaced-apart region 21 and the source region 40 functions as a channel region. The channel region is a region where an inversion layer is formed when the MOSFET 101 enters an ON state by controlling the potential of the gate electrode portion 60. A material contained in the wiring layer 82w is preferably lower in resistivity than that contained in the gate electrode portion 60. The gate electrode 82 is electrically insulated from the source electrode 80 and the test electrode 81. In other words, the gate electrode 82 is not short-circuited to the source electrode 80 and the test electrode 81.

The field insulating film 52 is formed on the semiconductor layer in the terminal region R2. Thus, the field insulating film 52 is separated from the well regions 30 and formed on the well region 31. The field insulating film 52 is thicker than the gate insulating film 50. The field insulating film 52 is disposed at the outermost circumference of the gate insulating film 50. The gate electrode portion 60 has an extension over the field insulating film 52. In the structure of FIG. 2, the field insulating film 52 has an inner circumference end that is in contact with an outermost circumference end of the gate insulating film 50.

The interlayer insulating film 55 covers the gate electrode portion 60 formed on the gate insulating film 50 and the field insulating film 52. The gate insulating film 55 is preferably made of silicon oxide. The interlayer insulating film 55 has a contact hole 95 that exposes the gate electrode portion 60 in the terminal region R2. In the contact hole 95, the wiring layer 82w of the gate electrode 82 is connected to the gate electrode portion 60. In a plan layout, the well region 31 includes the contact hole 95 and the wiring layer 82w of the gate electrode 82. This is because the well region 31 that has been grounded at a source potential blocks a high voltage to be applied to the drain electrode 85 to prevent application of a higher voltage to an insulating film (the field insulating film 52 in the structure of FIG. 2) below the wiring layer 82w having a significantly lower potential than the drain voltage.

An insulating layer including the gate insulating film 50 and the interlayer insulating film 55 has contact holes 90, 91, and 92. The contact holes 90 partly expose the surface of the semiconductor layer in the active region R1, specifically, part of the source regions 40, the high-concentration regions 35, and the spaced-apart region 22. Each of the contact holes 91 and 92 partly exposes the surface of the semiconductor layer in the terminal region R2, and partly exposes the high-concentration region 36 of the well region 31 according to Embodiment 1. The contact hole 91 is disposed closer to the active region R1 than the contact hole 92 is.

The field insulating film 52 is distant from both of the contact holes 91 and 92 according to Embodiment 1. Specifically, the field insulating film 52 is disposed more distant from the active region R1 than the contact hole 91 is, and is disposed more distant from the active region R1 than the contact hole 92 is.

The source electrode 80 is formed on a structure including the gate insulating film 50, the gate electrode portion 60, and the interlayer insulating film 55. The source electrode 80 includes the active region R1 in a plan layout. The source electrode 80 includes Schottky electrodes 75, ohmic contact parts 70, an ohmic contact part 71 (first ohmic contact part), and a wiring layer 80w. The wiring layer 80w mutually short-circuits the Schottky electrodes 75, the ohmic contact parts 70, and the ohmic contact part 71.

The Schottky electrodes 75 are disposed at the bottom of the contact holes 90, and are in contact with the drift layer 20 in the spaced-apart regions 22. Accordingly, the source electrode 80 is Schottky-connected to the drift layer 20 in the spaced-apart regions 22. With this structure, the active region R1 of the MOSFET 101 incorporates an SBD. Thus, the source electrode 80 has diode characteristics allowing unipolar conduction to the drift layer 20 between the well regions 30. This SBD is lower in diffusion potential than a p-n junction between the drift layer 20 and each of the well regions 30. The Schottky electrodes 75 not necessarily but preferably cover the surface of the spaced-apart regions 22. In contrast, the terminal region R2 of the MOSFET 101 does not incorporate an SBD.

The ohmic contact parts 70 are disposed at the bottom of the contact holes 90, and are in contact with the source regions 40. Accordingly, the source electrode 80 is ohmic-connected to the source regions 40. The ohmic contact parts 70 in the contact holes 90 are also in contact with the high-concentration regions 35 of the well regions 30. Accordingly, the source electrode 80 is ohmic-connected to the high-concentration regions 35 of the well regions 30. The contact of the ohmic contact parts 70 with the high-concentration regions 35 more facilitates exchanging electrons or positive holes between the ohmic contact parts 70 and the well regions 30.

The ohmic contact part 71 is disposed at the bottom of the contact hole 91, and is ohmic-connected to the high-concentration region 36 of the well region 31. Accordingly, the source electrode 80 is ohmic-connected to the high-concentration region 36 of the well region 31. The contact of the ohmic contact part 71 with the high-concentration region 36 more facilitates exchanging electrons or positive holes between the ohmic contact part 71 and the well region 31.

The test electrode 81 is separated from the gate electrode 82 and the source electrode 80. The test electrode 81 includes an ohmic contact part 72 (second ohmic contact part) and a wiring layer 81w. The ohmic contact part 72 is disposed at the bottom of the contact hole 92, and is in contact with the high-concentration region 36 of the well region 31. Accordingly, the ohmic contact part 72 is ohmic-connected to the high-concentration region 36 of the well region 31. With this structure, the test electrode 81 is in contact with the well region 31 and ohmic-connected to the well region 31. In a plan layout, it is preferred that the contact hole 91 is formed to enclose the active region R1 as completely as possible and that the test electrode 81 is also formed along the contact hole 91 to enclose the active region R1 as completely as possible.

The high-concentration region 36 extends not only immediately below the ohmic contact parts 71 and 72 but also over a wide range within the well region 31. This functions as reducing the resistance in a chip plane direction of the well region 31, that is, the sheet resistance. The high-concentration region 36 plays a role of preventing the gate insulating film 50 or the field insulating film 52 immediately above the well region 31 from breaking down due to variations in the potential inside the well region 31 during a switching operation of the MOSFET 101. For example, sudden increase in the potential of the drain electrode 85 during a turn-off operation of the MOSFET 101 suddenly increases the reverse bias to be applied to the p-n junction between the well region 31 and the drift layer 20. Here, in the well region 31, positive holes emitted due to depletion of an acceptor move inside the well region 31 in the chip plane direction, and are discharged through the contact hole 91 to the source electrode 80 grounded at 0 V. The positive holes appear as a displacement current which increases as the switching speed increases. The potential of each portion of the well region 31 increases by a voltage corresponding to a product of the magnitude of the displacement current and the resistance of a current path. In order to reduce the potential and prevent breakdown in the insulating film immediately above the well region 31, the high-concentration region 36 is preferably formed over a wide range as described above.

When the MOSFET 101 is viewed from above (FIG. 1), the source electrode 80, the test electrode 81, and the gate electrode 82 are exposed and are separated from one another in the upper surface of the MOSFET 101. The test electrode 81 includes a portion between the source electrode 80 and the gate electrode 82 according to Embodiment 1.

The test electrode 81 includes an electrode pad 81P (FIG. 1) exposed on the surface of the MOSFET 101. The electrode pad 81P is a region sufficiently large enough to place a probe needle, and preferably has a size equal to or larger than 30 μm square. In the plan view of FIG. 1, the test electrode 81 includes the electrode pad 81P and a linearly extending portion with a width smaller than the width of the electrode pad. Setting the width of the portion of the test electrode 81 other than the electrode pad 81P smaller as described above can suppress the dimension of the terminal region R2 including the test electrode 81. Accordingly, the chip size can be suppressed while the dimension of the active region R1, which is relevant to the device performance such as ON resistance of the MOSFET 101, is maintained. The shape of the electrode pad is not limited to the one illustrated in FIG. 1. As long as the test electrode 81 includes a region of 30 µm square or larger in the plan view, this region functions as an electrode pad.

With application of a potential exceeding that of the drain electrode 85 to the test electrode 81, a stress test to pass a stress current of high density to a parasitic p-n diode formed between the well region 31 and the drift layer 20 is conducted, which will be later described in detail. The electrode pad 81P has a probe trace 81M generated by placement of a probe needle to apply this potential. The current applying test does not require the electrode pad 81P when a potential is applied externally to the test electrode 81 without using the electrode pad 81P. The electrode pad 81P may be removed after the current applying test; in this case, the MOSFET 101 does not have the electrode pad 81P.

Figure 3:
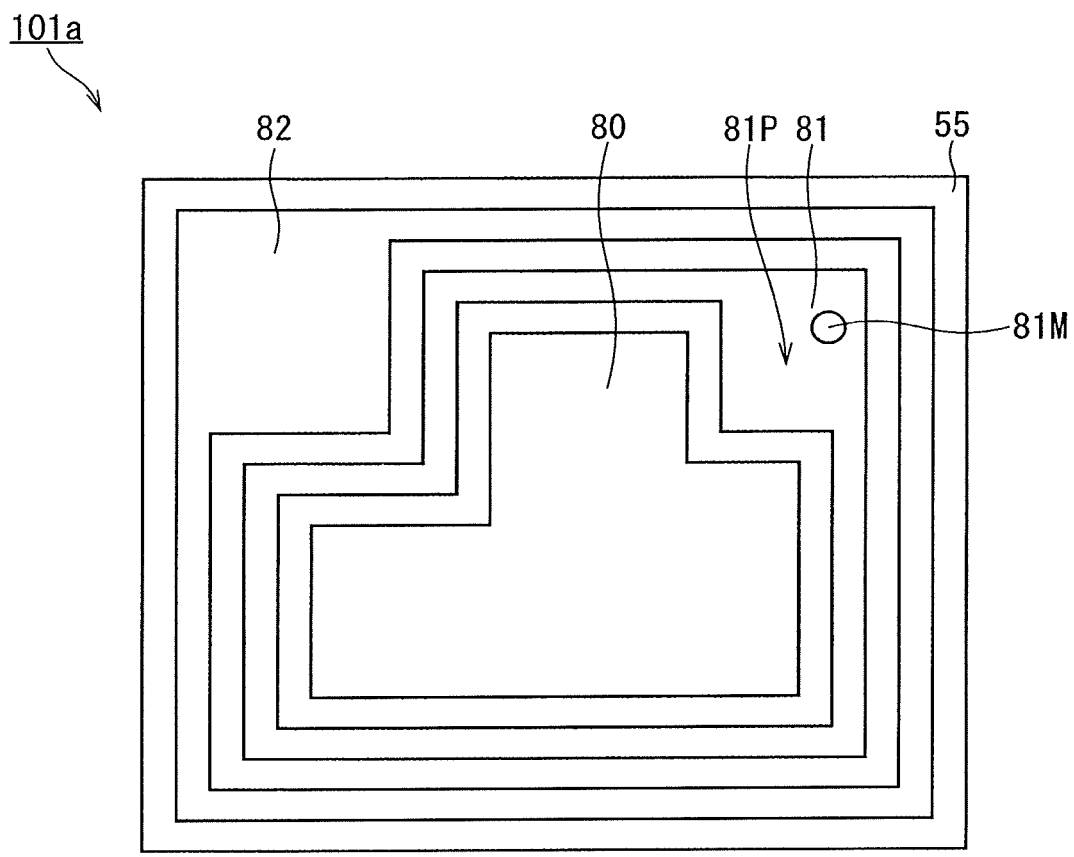
FIG. 3 is a plan view illustrating a modification of FIG. 1.

When the MOSFET 101 is viewed from above, the gate electrode 82 may be formed only with a region functioning as an electrode pad as illustrated in FIG. 1, or may have, in addition to the region, a wiring region linearly extending with a width smaller than that of the electrode pad as illustrated in FIG. 3.

(Manufacturing Method)

Next, a method for manufacturing the MOSFET 101 (FIG. 2) will be hereinafter described.

First, the drift layer 20 is formed on a surface of the substrate 10. Specifically, silicon carbide to which a donor impurity is added with an impurity concentration ranging from $1 \times 10^{15}$ cm$^{-3}$ to $1 \times 10^{17}$ cm$^{-3}$ is epitaxially grown on the substrate 10 with a thickness approximately ranging from 5 µm to 50 µm by a chemical vapor deposition (CVD) method.

Next, an implantation mask is formed on the surface of the drift layer 20 by, for example, photoresist. Al is selectively ion-implanted as an acceptor impurity, using this implantation mask. Here, the depth of the ion-implanted Al approximately ranges 0.5 µm to 3 µm which does not exceed the thickness of the drift layer 20. Furthermore, the impurity concentration of the ion-implanted Al ranges from $1 \times 10^{17}$ cm$^{-3}$ to $1 \times 10^{19}$ cm$^{-3}$, which is higher than the donor concentration of the drift layer 20. Then, the implantation mask is removed. With this process, the regions where Al is ion-implanted become the well regions 30 and 31. Thus, the well regions 30 and 31 can be collectively formed.

Next, another implantation mask is formed on the surface of the drift layer 20 by, for example, photoresist. Al is selectively ion-implanted as an acceptor impurity, using this implantation mask. Here, the depth of the ion-implanted Al approximately ranges 0.5 µm to 3 µm which does not exceed the thickness of the drift layer 20. Furthermore, the impurity concentration of the ion-implanted Al ranges from $1 \times 10^{16}$ cm$^{-3}$ to $1 \times 10^{18}$ cm$^{-3}$, which is higher than the first impurity concentration of the drift layer 20 and lower than the concentration of Al in the well regions 30. Then, the implantation mask is removed. With this process, the region where Al is ion-implanted becomes the JTE region 37.

Next, another implantation mask is formed on the surface of the drift layer 20 by, for example, photoresist. N, which is a donor impurity, is selectively ion-implanted using this implantation mask. The depth of the ion-implanted N is shallower than the thickness of the well regions 30. Furthermore, the impurity concentration of the ion-implanted N ranges from $1 \times 10^{18}$ cm$^{-3}$ to $1 \times 10^{21}$ cm$^{-3}$, which exceeds the acceptor concentration of the well regions 30. Of the N-implanted regions through this process, n-type regions become the source regions 40.

Next, another implantation mask is formed on the surface of the drift layer 20 by, for example, photoresist. Al, which is an acceptor impurity, is ion-implanted, using this implantation mask. Then, the implantation mask is removed. With this process, the Al-implanted regions become the high-concentration regions 35 and 36. An acceptor impurity is preferably ion-implanted while the substrate 10 or the drift layer 20 is heated to 150° C. or higher to reduce the resistance of the high-concentration regions 35 and 36.

The ion implantation processes described above may be performed in any order. Next, a heat treatment apparatus performs annealing at a temperature ranging from 1300 to 1900° C. in an inert gas atmosphere such as argon (Ar) for 30 seconds to 1 hour. Accordingly, the ion-implanted conductivity-type impurity is electrically activated.

Then, the field insulating film 52 including a silicon dioxide film and having a thickness approximately ranging from 0.5 to 2 µm is formed in a region excluding the positions almost corresponding to the active region R1. For example, after forming the field insulating film 52 on the entire surface by the CVD method, the portion of the field insulating film 52 at the positions almost corresponding to the active region R1 is removed using photolithography and etching techniques.

Next, the gate insulating film 50 made of silicon oxide and having a desired thickness is formed by thermally oxidizing the surface of silicon carbide that is not covered by the field insulating film 52. Then, a polycrystalline silicon film having conductivity is formed on the gate insulating film 50 by a low pressure CVD method, and is patterned to form the gate electrode portion 60. Then, the interlayer insulating film 55 is formed by the low pressure CVD method. Then, openings for exposing portions at which the ohmic contact parts 70 to 72 are to be formed in the semiconductor layer are formed in the interlayer insulating film 55 and the gate insulating film 50.

Next, a metal film that mainly contains nickel (Ni) is formed by, for example, sputtering. Then, this film is thermally treated at a temperature ranging from 600 to 1100° C. Accordingly, silicide is formed between the silicon carbide layer and the metal film in the openings. Then, the remaining non-silicided portions of the metal film are removed. The portions can be removed by wet-etching using, for example, one of sulfuric acid, nitric acid, and hydrochloric acid or a mixture solution of these acids and a hydrogen peroxide solution. Accordingly, the ohmic contact parts 70 to 72 are formed.

Next, a metal film that mainly contains Ni is formed on the lower surface of the substrate 10. This metal film is thermally treated to form the ohmic electrode 79 on the back side of the substrate 10.

Next, portions of the gate insulating film 50 and the interlayer insulating film 55 above the spaced-apart regions 22, and a portion of the interlayer insulating film 55 at which the contact hole 95 is to be formed are removed by patterning technology using, for example, photoresist. The portions are preferably removed by wet-etching that does not damage the surface of silicon carbide to be an SBD interface.

Then, the Schottky electrodes 75 are deposited by, for example, sputtering. The material to be deposited is preferably Ti, Mo, or Ni.

Then, a wiring metal layer made of, for example, Al is formed by sputtering or vapor deposition on the surface of the substrate 10 that has been processed up to this point, and is processed into a predetermined shape by photolithography technique. Accordingly, the wiring layer 80w that is in contact with the ohmic contact parts 70 and 71 and the Schottky electrodes 75, the wiring layer 81w that is in contact with the ohmic contact part 72, and the wiring layer 82w that is in contact with the gate electrode portion 60 are formed. Furthermore, the drain electrode 85 that is a metal film is formed on the surface of the ohmic electrode 79 that is formed on the lower surface of the substrate 10.

Accordingly, a semifinished product of the MOSFET 101 including the substrate 10, the semiconductor layer on the substrate 10 as described above, the gate insulating film 50, the field insulating film 52, the interlayer insulating film 55, the source electrode 80, the test electrode 81, the gate electrode 82, and the drain electrode 85 is formed.

Next, the stress test is performed on the semifinished product of the MOSFET 101. Specifically, the p-n junction between the well region 31 the drift layer 20 is forward biased with increase in the potential of the test electrode 81 with respect to the drain electrode 85. A probe needle is brought in contact with the electrode pad 81P (FIG. 1) of the test electrode 81 to apply this potential. Here, the probe needle needs to be inserted into the electrode pad 81P to reduce the contact resistance between the probe needle and the electrode pad 81P. Consequently, the probe trace 81M is formed on the electrode pad 81P.

The voltage to be applied between the test electrode 81 and the drain electrode 85 in the stress test is set lower than the voltage between the source electrode 80 and the drain electrode 85. In other words, the potential of the source electrode 80 is set lower than that of the test electrode 81. Preferably, the potential of the source electrode 80 is set not to exceed the diffusion potential of the parasitic p-n diode with respect to the potential of the drain electrode 85. The potential of the source electrode 80 may be a floating potential without any external application of a potential. Here, the potential of the source electrode 80 is a potential between the potential of the test electrode 81 and the potential of the drain electrode 85, and thus is lower than the potential of the test electrode 81.

With application of the potential as described above, the stress current flows through the parasitic p-n diode formed between the well region 31 and the drift layer 20 more preferentially than through the parasitic p-n diode formed between each of the well regions 30 and the drift layer 20. When the potential is applied, the potential of the gate electrode 82 is preferably as high as that of the test electrode 81 or lower than that of the test electrode 81 to reliably turn OFF the channel.

When the stress current is applied to the parasitic p-n diode formed between the well region 31 and the drift layer 20, if an origin of faults such as basal plane dislocations exists in this parasitic p-n diode, the triangular stacking faults extend. The extension of the faults influences the current-carrying characteristics between the drain electrode 85 and the source electrode 80 or the test electrode 81.

After this stress test, the current-carrying characteristics between the electrodes are measured, and abnormal products are rejected. In other words, after a plurality of semifinished products are formed, they are screened by the stress test. The current-carrying characteristics may be resistance values or breakdown characteristics. For example, with application of a current between the test electrode 81 and the drain electrode 85, an element having a larger voltage drop is rejected. Furthermore, similar measurements may be performed before the stress test, and a resulting amount of variations in the characteristics before and after the stress test may determine whether the element needs to be rejected.

As described above, after the current stress is applied to the parasitic p-n diode, the source electrode 80 and the test electrode 81 are preferably short-circuited. In other words, the MOSFET 101 is preferably provided with a wiring part 89 that electrically short-circuits the source electrode 80 and the test electrode 81. The wiring part 89 may be provided above the source electrode 80 and the test electrode 81 to be easily formed, and is formed as, for example, a bonding wire by wire bonding.

Consequently, the MOSFET 101 is obtained.

(Free-Wheeling Operation in Practical Use)

When the potential of the source electrode 80 exceeds that of the drain electrode 85, the MOSFET 101 performs a free-wheeling operation. Since a current passes through the incorporated SBD in the active region R1, a forward current does not flow through the p-n diode formed by each of the well regions 30 and the drift layer 20. In contrast, since the terminal region R2 does not incorporate an SBD, a forward current flows through the p-n diode formed by the well region 31 and the drift layer 20.

If the p-n diode formed by the well region 31 and the drift layer 20 in the terminal region R2 has an origin of faults such as basal plane dislocations, extension of the triangular stacking faults degrades the characteristics of the transistor. Since the MOSFET 101 according to Embodiment 1 has undergone the screening, such degradation in the characteristics hardly occurs.

(Comparative Example)

Figure 4:
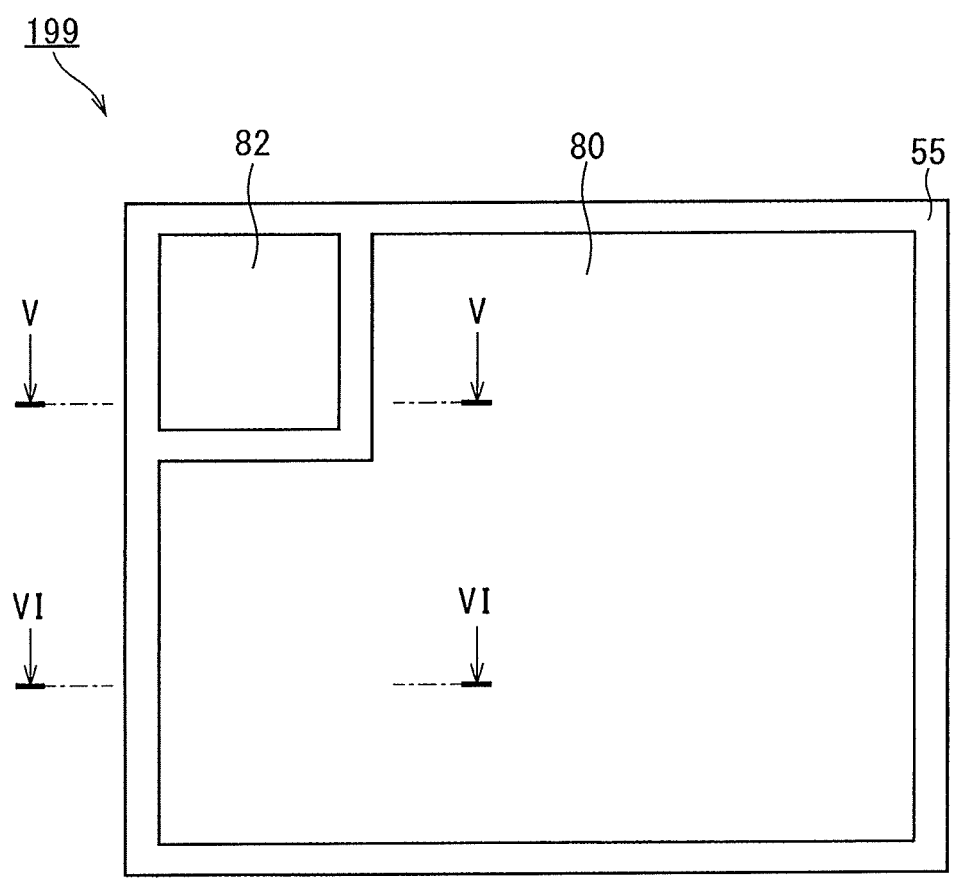
FIG. 4 is a plan view schematically illustrating a structure of a semiconductor device of a comparative example.
Figure 5:
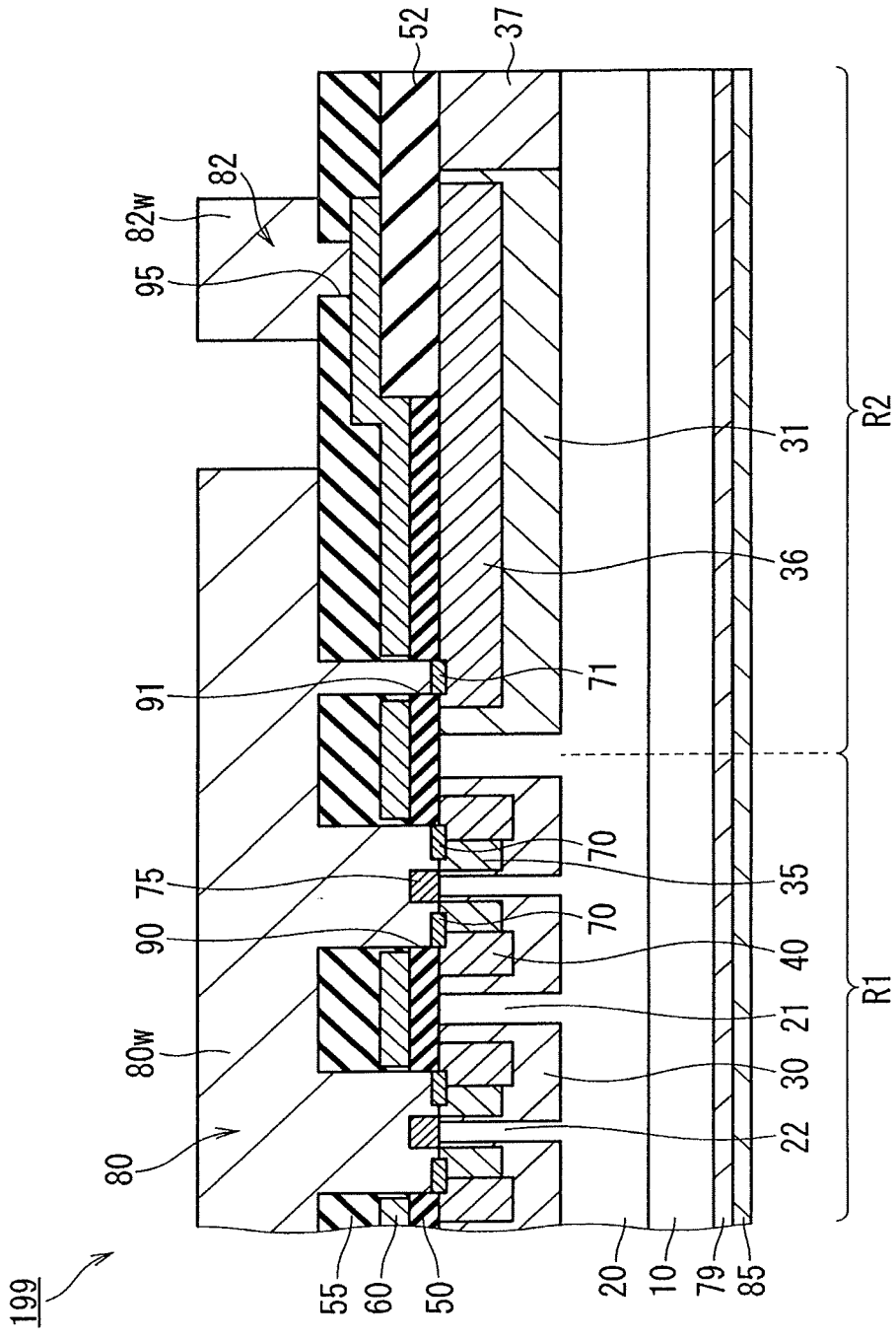
FIG. 5 is a schematic partial sectional view taken from the line V-V in FIG. 4.
Figure 6:
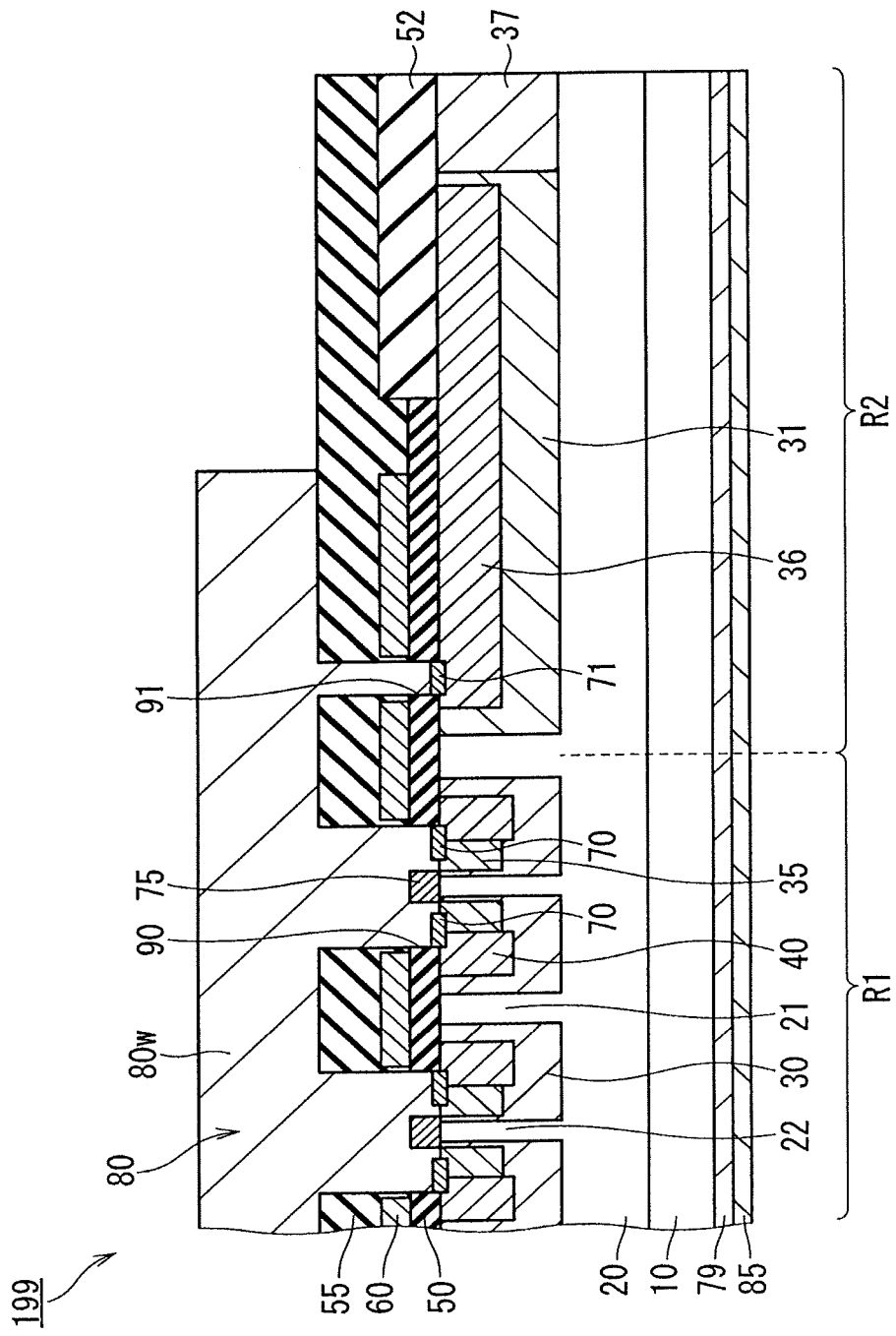
FIG. 6 is a schematic partial sectional view taken from the line VI-VI in FIG. 4.

A MOSFET 199 (FIGS. 4 to 6) of a comparative example does not include the described test electrode 81. Thus, application of a potential in the stress test requires using the source electrode 80. Here, the source electrode 80 is also in contact with the active region R1, which incorporates an SBD with a lower operating voltage than that of the p-n diode. Thus, most of the stress current flows through the active region R1 that does not require the stress test. The current that passes through the SBD incorporated in the active region R1 also generates heat in the elements through Joule heating that is dependent on a voltage drop in the device. Thus, an amount of passing current needs to be suppressed to prevent a chip or evaluation equipment from being thermally damaged by this heat. Consequently, the p-n diode formed by the well region 31 and the drift layer 20 in the terminal region R2 has a lower stress current density. Thus, the time required for the stress test is prolonged.

When a larger amount of the stress current flows through the active region R1, the current also begins to flow through the parasitic p-n diode formed by each of the well regions 30 and the drift layer 20 in the active region R1. This is because increase in the current density in the SBD increases the voltage drop in the spaced-apart regions 22, thus increasing the forward bias applied to the p-n diodes. As a result, the stacking faults are formed in the active region R1, in which the stress test is not originally necessary. Accordingly, for example, the forward bias in the MOSFET 199 may be subject to change. When such product is rejected through screening, the manufacturing yield decreases.

(Advantages)

According to Embodiment 1, the test electrode 81 in contact with the well region 31 in the terminal region R2 is provided separately from the source electrode 80 in contact with the well regions 30 in the active region R1. The stress test to forward bias the p-n junction between the well region 31 the drift layer 20 using the test electrode 81 can suppress the stress current flowing through the active region R1. Accordingly, first, an amount of heat generated in the active region R1 during the stress test becomes smaller. Thus, since a higher current can be applied in the stress test, the stress test can be conducted in a shorter period of time. Second, formation of the stacking faults in the active region R1 during the stress test is suppressed. Accordingly, variations in the transistor characteristics caused by the stress test hardly occur. Consequently, the time for the stress test can be shortened, and variations in the transistor characteristics caused by the stress test can be suppressed.

The electrode pad 81P can facilitate the external application of the stress current. Particularly, a probe needle can be easily placed on the electrode pad 81P to allow the stress current to flow. The probe trace 81M formed on the electrode pad 81P can facilitate recognition of the stress current that has already been applied. A device including a plurality of electrode pads with respective probe traces can apply a stress separately for each of the electrode pads and does not require any additional process of removing the pads afterward; therefore, it can apply stresses of different kinds without increasing the cost.

With the source electrode 80 and the test electrode 81 short-circuited by the wiring part 89, the potential of the well region 31 can reliably approximate that of the source electrode 80. Thus, it is possible to prevent application of a higher voltage to the gate insulating film 50 and the field insulating film 52 on the well region 31. Since the high-concentration region 36 joins the source electrode 80 and the test electrode 81 according to Embodiment 1, the potential of the well region 31 can approximate that of the source electrode 80 to some extent even with the omission of the wiring part 89.

The source electrode 80 and the test electrode 81 can be ohmic-connected to the well region 31 through the ohmic contact parts 71 and 72, respectively.

Embodiment 2

Figure 2:
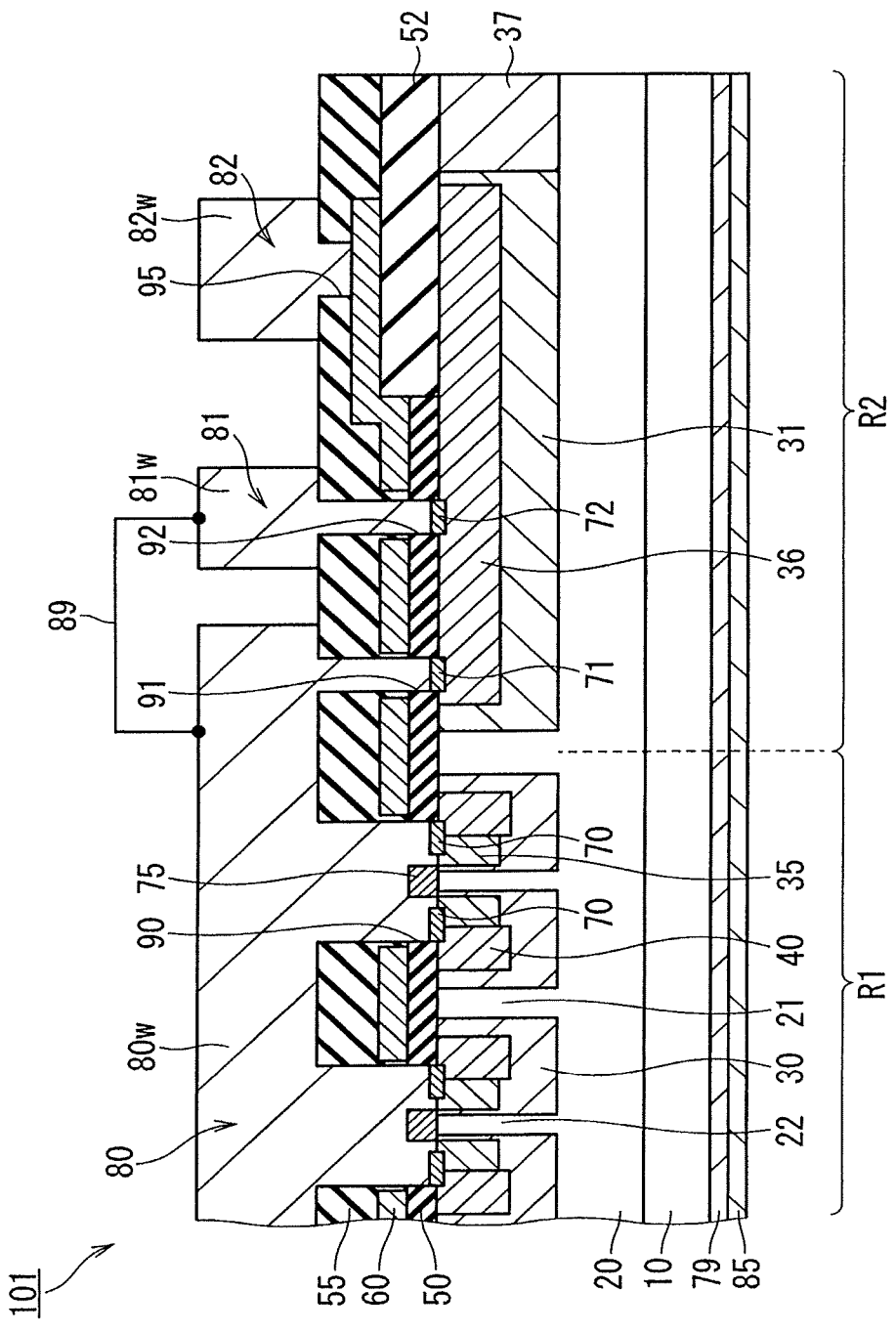
FIG. 2 is a schematic partial sectional view taken from the line II-II in FIG. 1.
Figure 7:
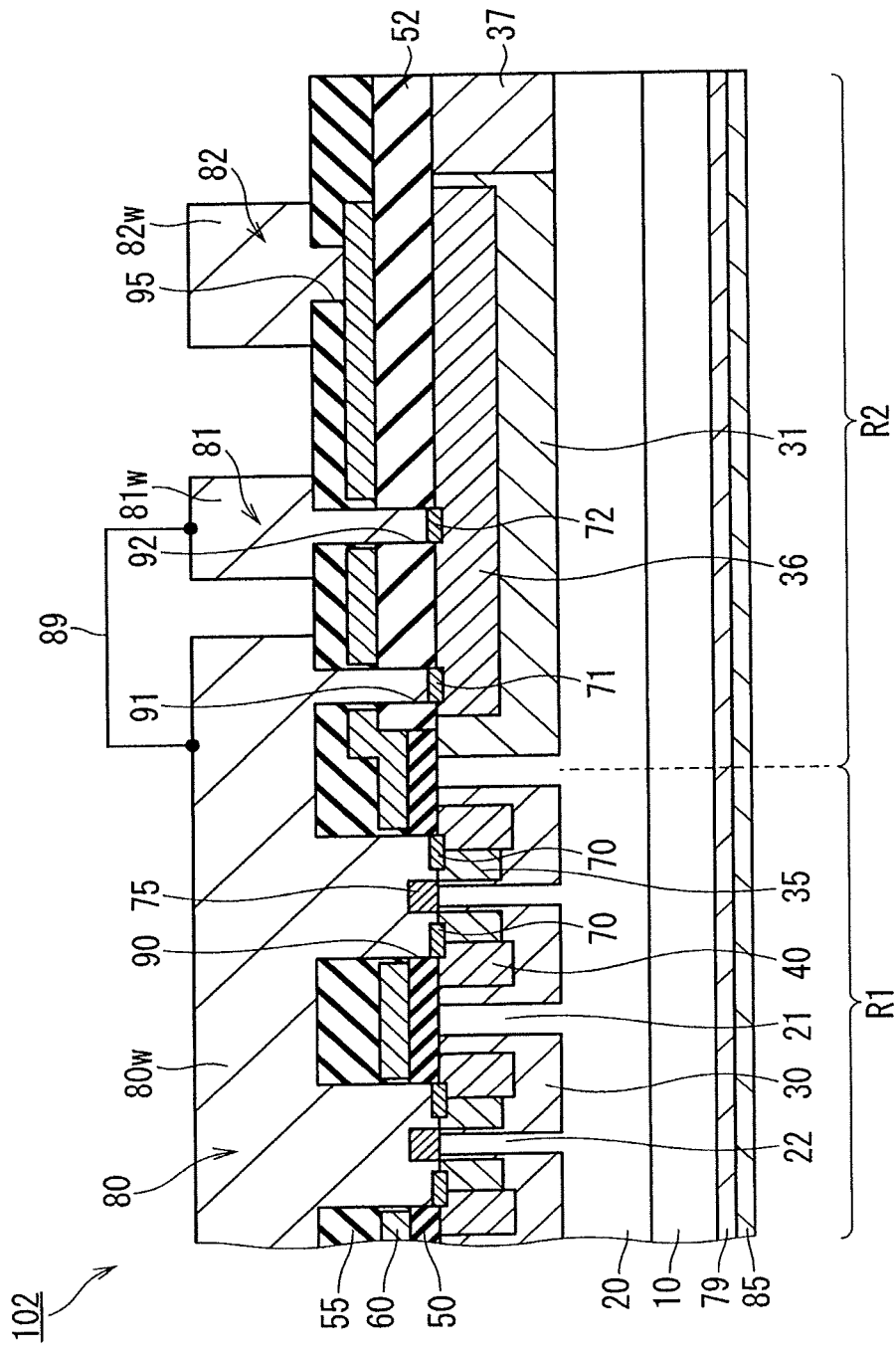
FIG. 7 is a partial sectional view schematically illustrating a structure of a semiconductor device according to Embodiment 2 of the present invention.

With reference to FIG. 7, the field insulating film 52 extends to a position closer to the active region R1 in a MOSFET 102 (semiconductor device) according to Embodiment 2 than that of the MOSFET 101 (FIG. 2). In other words, a boundary between the field insulating film 52 and the gate insulating film 50 is positioned closer to the active region R1 than the contact holes 91 and 92 are. As a result, the contact holes 91 and 92 penetrate not only the interlayer insulating film 55 but also the field insulating film 52. Thus, the ohmic contact parts 71 and 72 are disposed in the contact holes 91 and 92 provided in the field insulating film 52, respectively.

Since the structures other than above are almost the same as those according to Embodiment 1, the same or corresponding constituent elements are denoted by the same reference numerals and the description thereof will not be repeated.

During a switching operation of the MOSFET 102, the potential of the well region 31 increases according to a displacement current. According to Embodiment 2, the field insulating film 52 thicker than the gate insulating film 50 is provided in the vicinity of the ohmic contact parts 71 and 72 that are connected to the well region 31, whose potential increases as described above. Accordingly, breakdown in the insulating films in the vicinity of the ohmic contact parts 71 and 72 is suppressed.

An end portion of the field insulating film 52 closer to the active region R1 is preferably closer to the active region R1 than an end portion of the high-concentration region 36 closer to the active region R1 is. This is because if the gate insulating film 50 is formed even on the high-concentration region 36, the insulating properties of the gate insulating film 50 to be formed decrease on the high-concentration region 36 due to the higher impurity concentration in the high-concentration region 36. The end portion of the field insulating film 52 closer to the active region R1 is preferably, in a plan view, in the well region 31.

A method for manufacturing the MOSFET 102 is almost the same as that of the MOSFET 101. The difference is a requirement of etching the field insulating film 52 in the positions of the contact holes 91 and 92 to provide the contact holes 91 and 92. This etching can be performed simultaneously with the etching process of the field insulating film 52 described in Embodiment 1.

Both of the ohmic contact parts 71 and 72 are disposed in the contact holes provided in the field insulating film 52 according to Embodiment 2. As the modification, only one of the ohmic contact parts 71 and 72 may be disposed in the contact holes provided in the field insulating film 52. Here, the described advantages are obtained in the vicinity of one of the ohmic contact parts.

Embodiment 3

Figure 8:
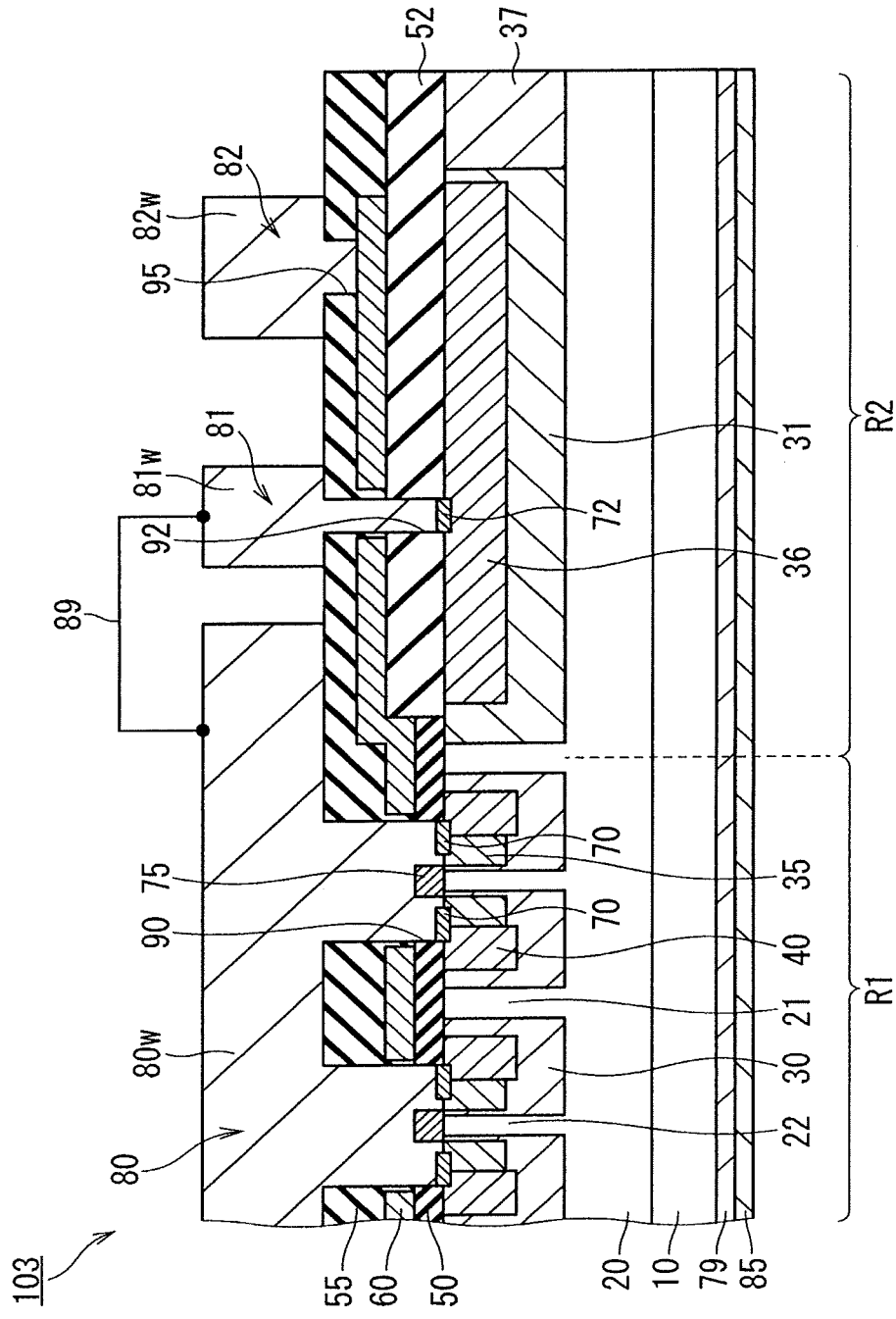
FIG. 8 is a partial sectional view schematically illustrating a structure of a semiconductor device according to Embodiment 3 of the present invention.

With reference to FIG. 8, a MOSFET 103 (semiconductor device) according to Embodiment 3 does not include the contact hole 91 unlike the MOSFET 102 (FIG. 7). Thus, the source electrode 80 and the well region 31 are separated by the insulating films. In a practical use of the MOSFET 103 according to Embodiment 3, the wiring part 89 needs to short-circuit the source electrode 80 and the test electrode 81 after application of the stress current to prevent the potential of the well region 31 from being in a floating state.

Since the structures other than above are almost the same as those according to Embodiment 2, the same or corresponding constituent elements are denoted by the same reference numerals and the description thereof will not be repeated.

According to Embodiment 3, the current to be applied by the test electrode 81 in the stress test can be prevented from leaking to the active region R1 through a current path passing through the contact hole 91. Accordingly, the time for the stress test can be shortened. With reference to FIG. 7, the current path reaches the drain electrode 85 through, in order from the test electrode 81, the well region 31, the ohmic contact part 71, the wiring layer 80w, the Schottky electrodes 75, and the spaced-apart regions 22.

Embodiment 4

Figure 9:
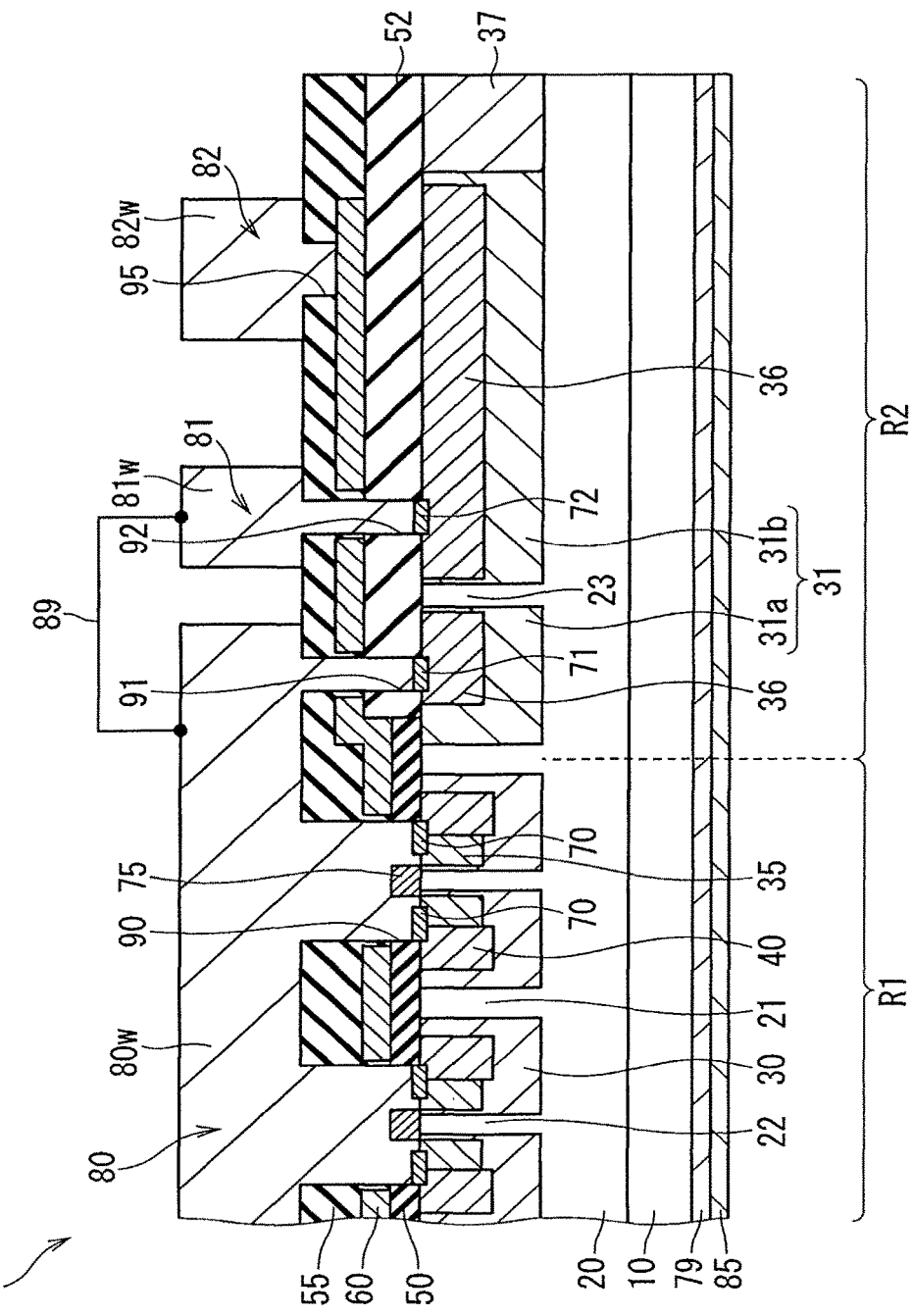
FIG. 9 is a partial sectional view schematically illustrating a structure of a semiconductor device according to Embodiment 4 of the present invention.

With reference to FIG. 9, the well region 31 in a MOSFET 104 (semiconductor device) according to Embodiment 4 includes a plurality of well regions 31a and 31b that are separated from each other by a spaced-apart region 23 included in the drift layer 20. The well region 31a is connected to the ohmic contact part 71, and the well region 31b is connected to the ohmic contact part 72. In other words, among the plurality of well regions 31, the well region that is ohmic-connected to the ohmic contact part 71 is different from the well region that is ohmic-connected to the ohmic contact part 72. The width of the spaced-apart region 23 is preferably smaller than or equal to the width of the spaced-apart region 21 or 22 so as not to reduce the breakdown voltage.

In a practical use of the MOSFET 104 according to Embodiment 4, the wiring part 89 needs to short-circuit the source electrode 80 and the test electrode 81 after application of the stress current to prevent the potential of the well region 31 from being in a floating state.

Since the structures other than above are almost the same as those according to Embodiment 2, the same or corresponding constituent elements are denoted by the same reference numerals and the description thereof will not be repeated.

According to Embodiment 4, it is possible to prevent the test electrode 81 including the ohmic contact part 72 and the source electrode 80 including the ohmic contact part 71 from being joined by one well region. Accordingly, the advantages closer to those according to Embodiment 3 are obtained. In other words, it is possible to suppress the stress current flowing from the test electrode 81 to the well regions 30 through the source electrode 80 and to shorten the time for the stress test.

The stress current applied from the test electrode 81 hardly flows through a region closer to the active region R1 than the spaced-apart region 23 is. The origin of faults in such a region is hardly reflected on the result of the stress test. In order to avoid this, the spaced-apart region 23 is preferably disposed as close to the contact hole 91 as possible. Specifically, the spaced-apart region 23 is preferably brought closer to the contact hole 91 than to the contact hole 92.

Embodiment 5

Figure 10:
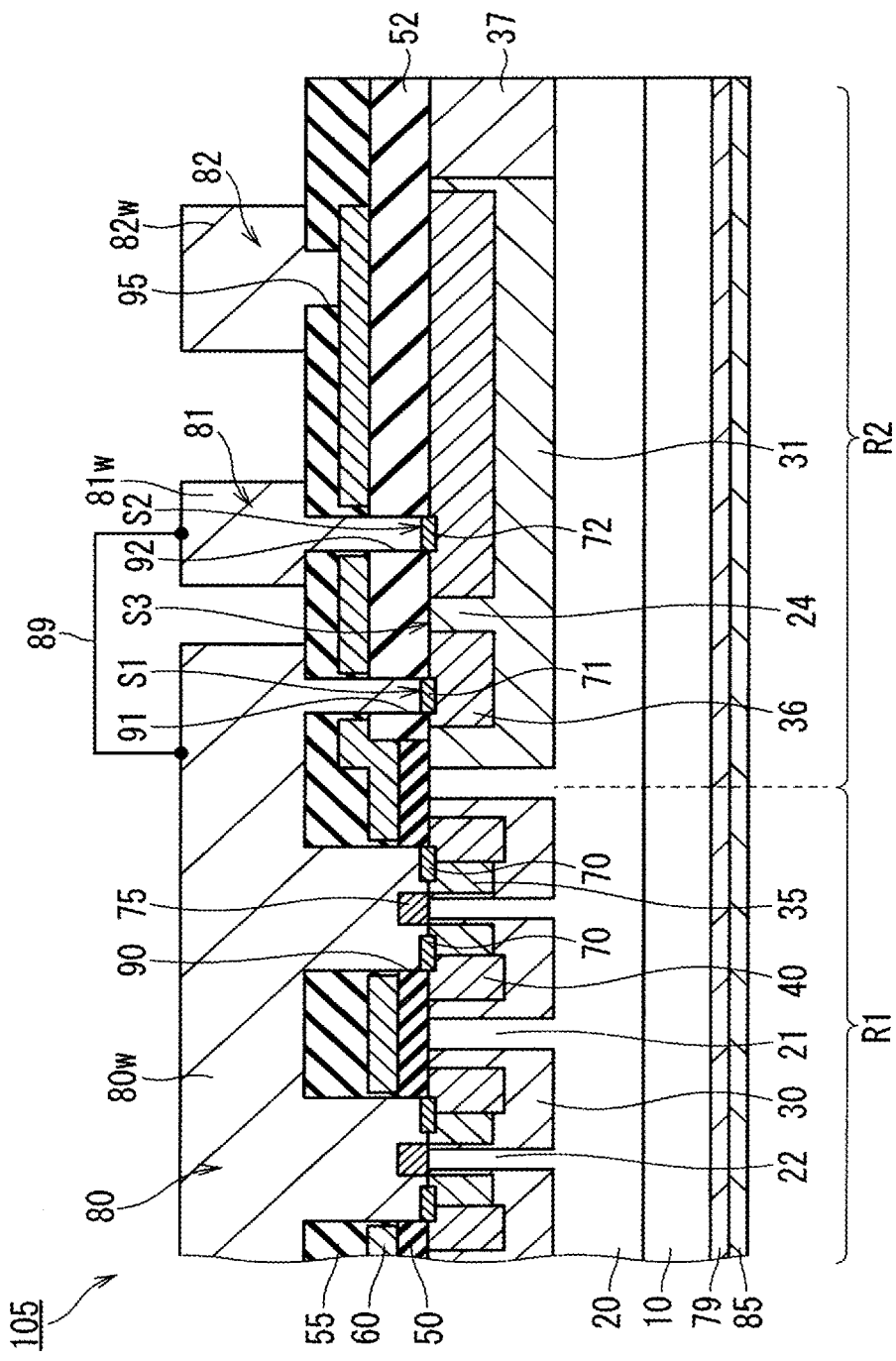
FIG. 10 is a partial sectional view schematically illustrating a structure of a semiconductor device according to Embodiment 5 of the present invention.

With reference to FIG. 10, a MOSFET 105 (semiconductor device) according to Embodiment 5 has a region where the high-concentration region 36 is not formed between the contact holes 91 and 92. In other words, the high-concentration region 36 has a spaced-apart region 24 between the contact holes 91 and 92. The spaced-apart region 24 is a region other than the high-concentration region 36 in the well region 31. Thus, the spaced-apart region 24 has a sheet resistance higher than that of a region where the high-concentration region 36 has been formed.

In other words, the MOSFET 105 has the following structure. The one well region 31 has a plane S1 (first plane) that is ohmic-connected to the ohmic contact part 71, and a plane S2 (second plane) that is ohmic-connected to the ohmic contact part 72. This well region 31 has a plane S3 (third plane) that separates the plane S1 and the plane S2. In this well region 31, the sheet resistance of the plane S3 is higher than the sheet resistance of each of the plane S1 and the plane S2.

Since the structures other than above are almost the same as those according to Embodiment 2, the same or corresponding constituent elements are denoted by the same reference numerals and the description thereof will not be repeated.

According to Embodiment 5, a portion along the plane S3 with a higher sheet resistance is provided in an electrical path between the test electrode 81 including the ohmic contact part 72 and the source electrode 80 including the ohmic contact part 71. Thus, it is possible to suppress leakage of the stress current flowing from the test electrode 81 to the well regions 30 through the source electrode 80. Accordingly, the time for the stress test can be shortened.

Furthermore, since the one well region 31 joins the source electrode 80 and the test electrode 81, it is avoided that the potential of the second well connected to the test electrode 81 considerably differs from that of the source electrode 80, without always attaching the wiring part 89 for short-circuiting the source electrode 80 and the test electrode 81.

The stress current applied from the test electrode 81 hardly flows through a region closer to the active region R1 than the spaced-apart region 24 is. The origin of faults in such a region is hardly reflected on the result of the stress test. In order to avoid this, the spaced-apart region 24 is preferably disposed as close to the contact hole 91 as possible. Specifically, the spaced-apart region 24 is preferably brought closer to the contact hole 91 than to the contact hole 92.

Embodiment 6

Figure 11:
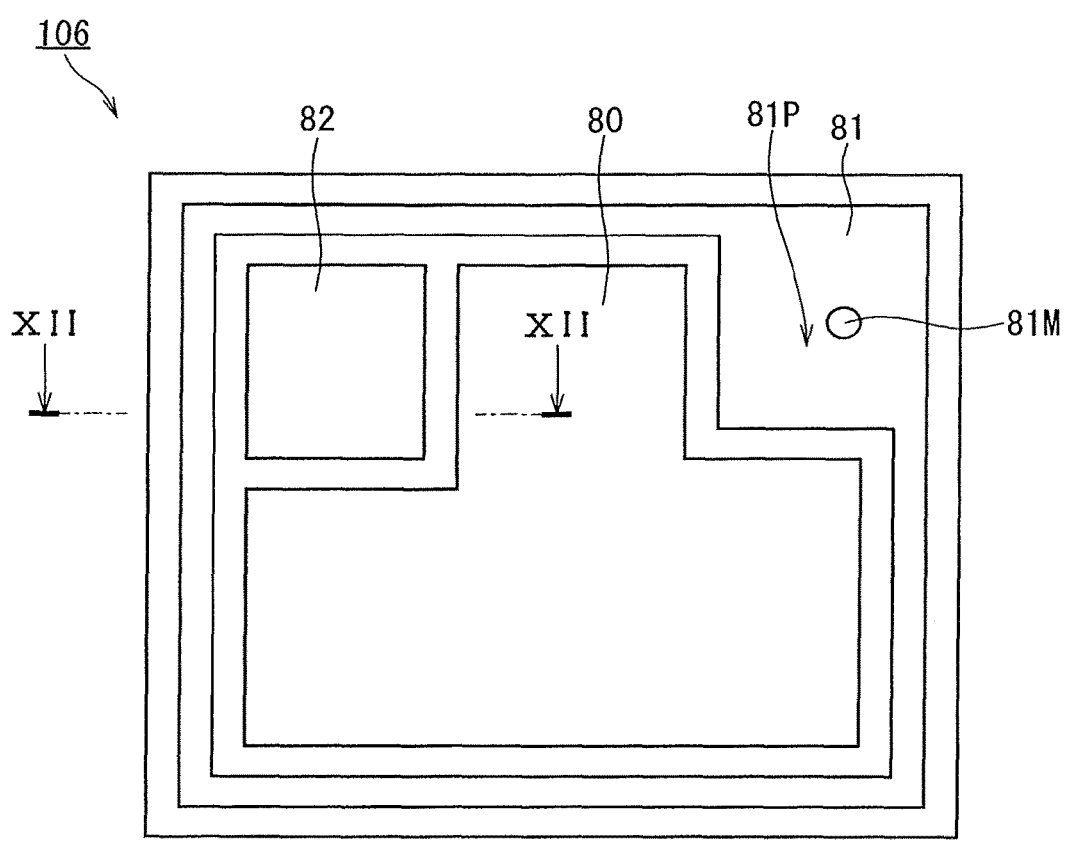
FIG. 11 is a plan view schematically illustrating a structure of a semiconductor device according to Embodiment 6 of the present invention.
Figure 12:
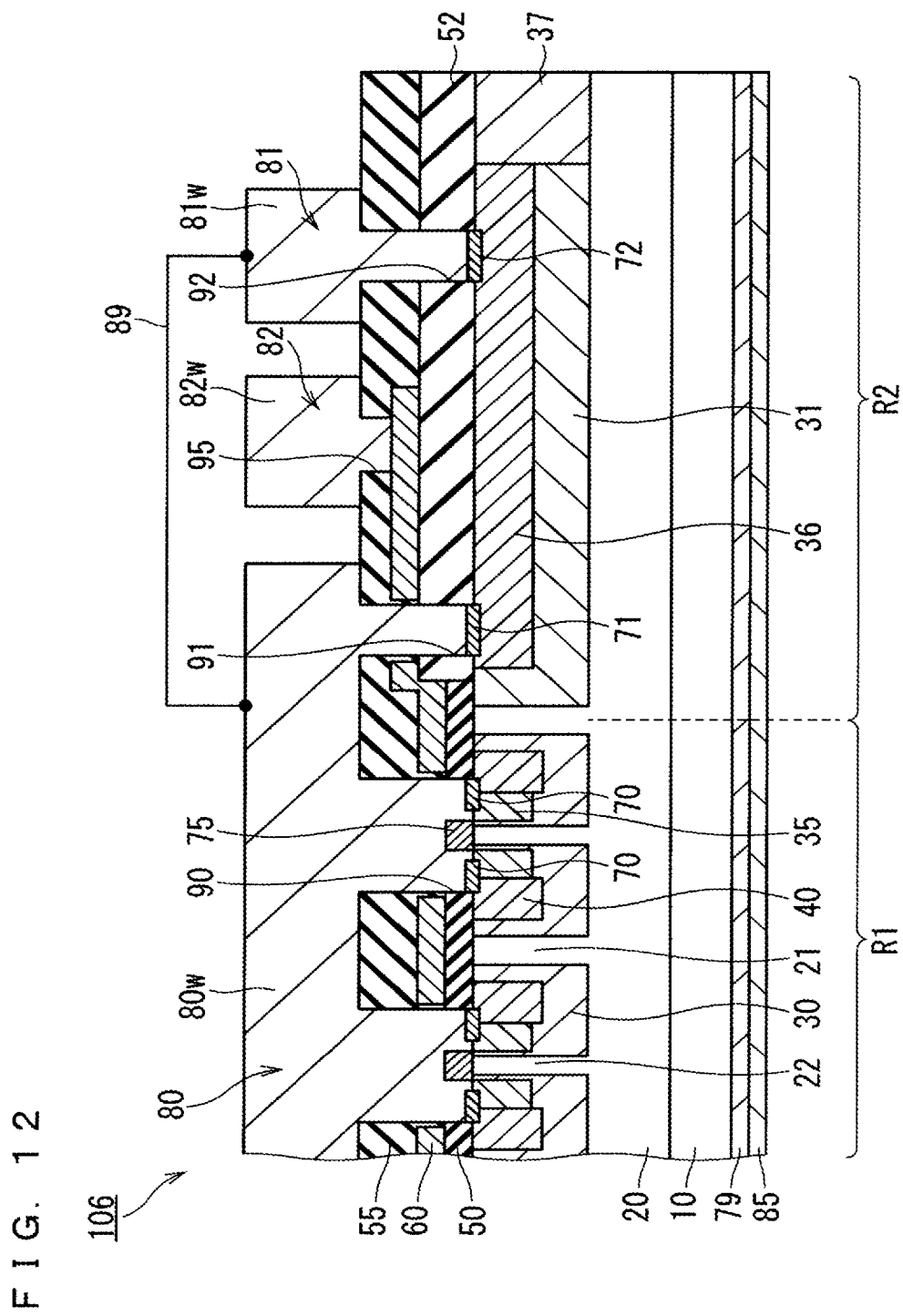
FIG. 12 is a schematic partial sectional view taken from the line XII-XII in FIG. 11.

With reference to FIGS. 11 and 12, the gate electrode 82 is positioned between the source electrode 80 and the test electrode 81 in a MOSFET 106 (semiconductor device) in a plan view, unlike the MOSFET 101 (FIG. 1). With this structure, the test electrode 81 has a portion distant from the active region R1 than the gate electrode 82 is.

A method for manufacturing the MOSFET 106 is almost the same as that of the MOSFET 101. The mask layout may be changed between when the gate electrode 82 and the test electrode 81 are formed and when the contact holes 92 and 95 are formed, as the difference.

Since the structures other than above are almost the same as those according to Embodiment 1, the same or corresponding constituent elements are denoted by the same reference numerals and the description thereof will not be repeated. Embodiment 6 also obtains the same advantages as those according to Embodiment 1.

Figure 13:
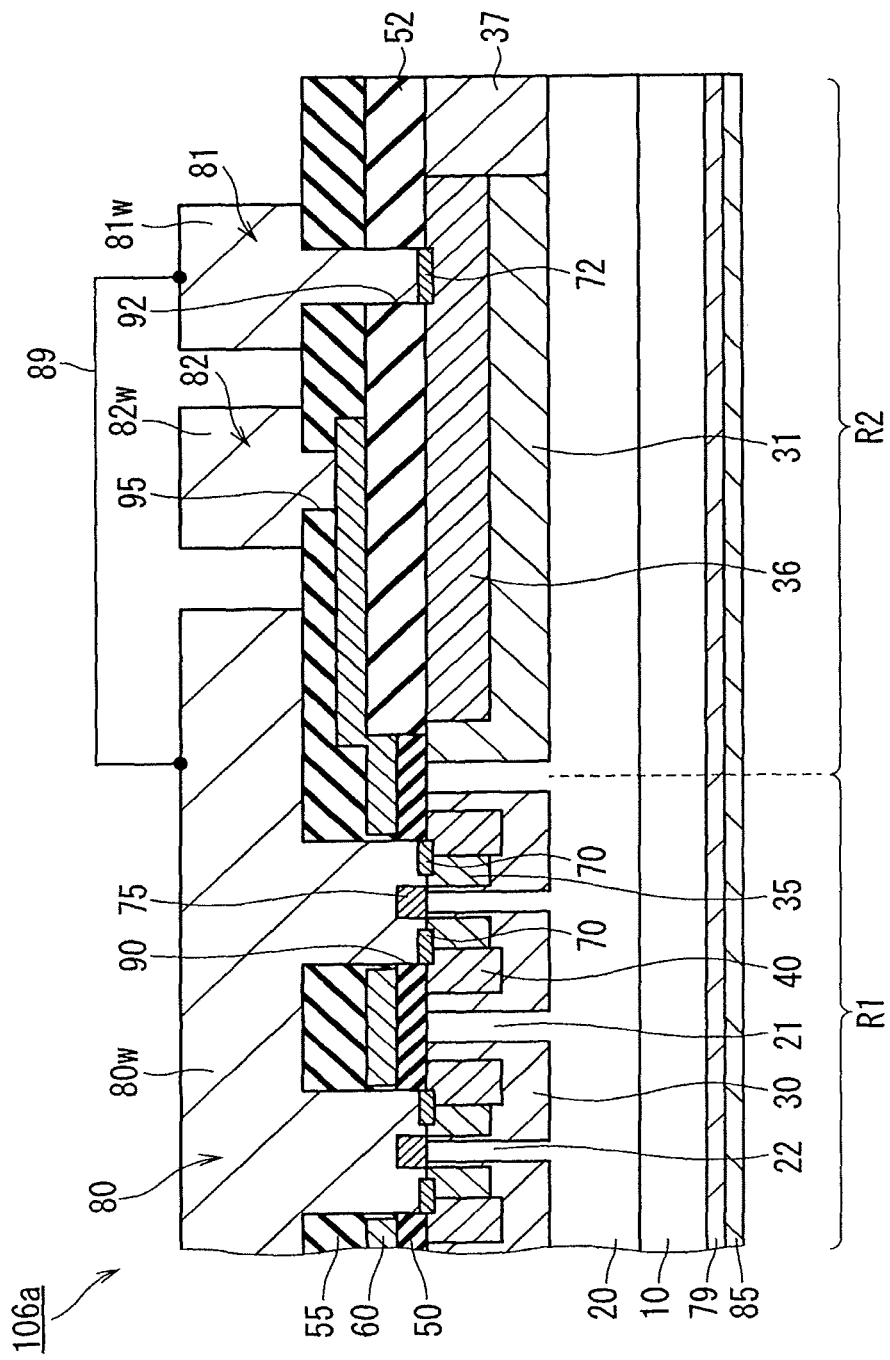
FIG. 13 illustrates a first modification of FIG. 12.
Figure 14:
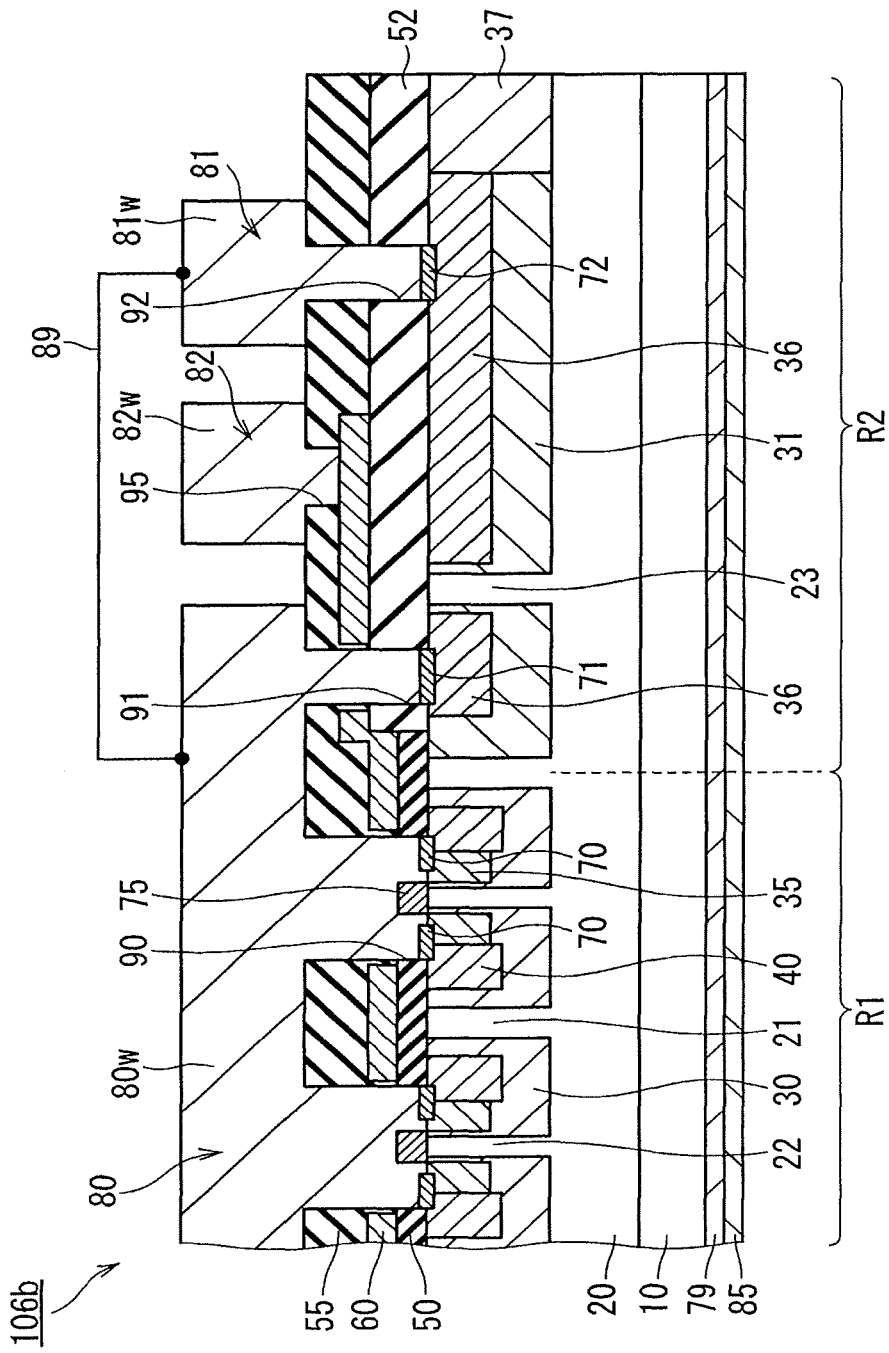
FIG. 14 illustrates a second modification of FIG. 12.
Figure 15:
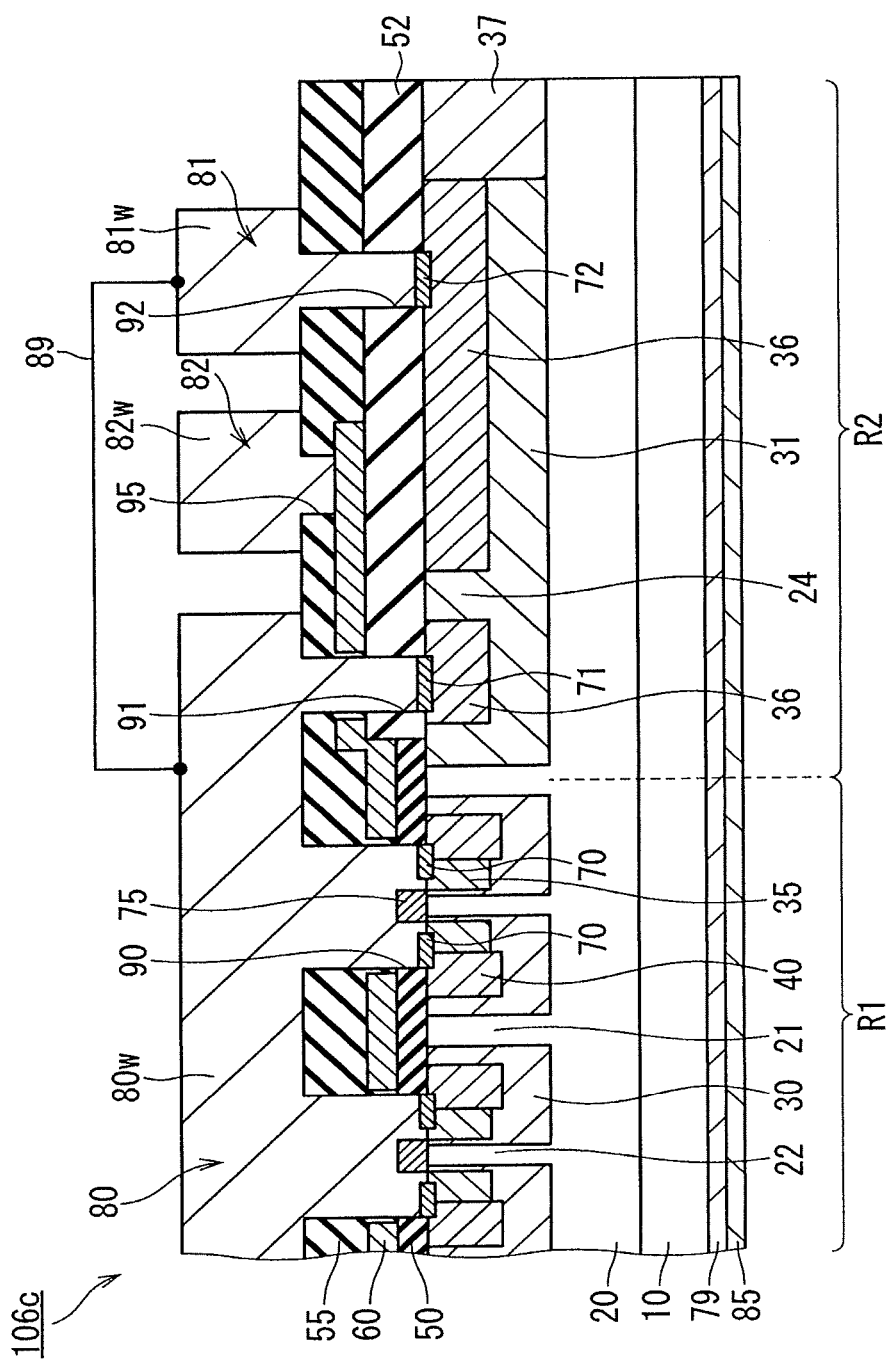
FIG. 15 illustrates a third modification of FIG. 12.

Next, MOSFETs 106a to 106c (semiconductor devices) of modifications will be described with reference to FIGS. 13 to 15, respectively. Since the contact hole 91 is omitted in the MOSFET 106a similarly as according to Embodiment 3, the same advantages as those according to Embodiment 3 are obtained. Since the spaced-apart region 23 is provided in the MOSFET 106b similarly as according to Embodiment 4, the same advantages as those according to Embodiment 4 are obtained. Since the spaced-apart region 24 is provided in the MOSFET 106c similarly as according to Embodiment 5, the same advantages as those according to Embodiment 5 are obtained.

In the Description, the electrical connection with lower resistance is referred to as "ohmic-connected", and the structure for achieving such ohmic connection is referred to as an "ohmic contact part" or an "ohmic electrode". The "connection with lower resistance" herein means, for example, a connection with a contact resistance lower than or equal to 100 $\Omega cm^2$, and does not necessarily satisfy ohmic characteristics of having complete linearity as current/voltage characteristics in a narrow sense.

Furthermore, although the first conductivity type is defined as n-type conductivity and the second conductivity type is defined as p-type conductivity in each of Embodiments above, conversely, the first conductivity type may be defined as p-type conductivity and the second conductivity type may be defined as n-type conductivity. In such a case, the details about the potential height described above are the other way around.

Furthermore, the Schottky electrodes 75 and the source electrode 80 may be made of the same material in each of Embodiments above. In such a case, the Schottky electrodes 75 and the source electrode 80 can be collectively formed.

Although the MOSFETs are described as semiconductor devices in Embodiments above, a material other than oxides may be used as a material for the gate insulating film. In other words, the semiconductor devices may be metal-insulator-semiconductor field-effect transistors (MISFETs) other than MOSFETs. Furthermore, the semiconductor devices are not limited to the MISFETs but may be unipolar transistors including unipolar diodes. The unipolar transistors may be, for example, junction field-effect transistors (JFETs).

Furthermore, although the unipolar transistor incorporates an SBD in each of Embodiments above, the source electrode 80 may have the diode characteristics allowing unipolar conduction to the drift layer 20 between the well regions 30, without the SBD element. Specifically, the SBD to be incorporated in the unipolar transistor may replace, for example, a FET having channel characteristics allowing a current to pass only in a direction from the source to the drain with an OFF-potential given to the gate.

Furthermore, although silicon carbide is used as a wide bandgap semiconductor that is a material of the drift layer 20 in each of Embodiments above, another wide bandgap semiconductor may be used. When a forward current flows through a parasitic p-n diode, not limited to silicon carbide but a wide bandgap semiconductor having recombined energy greater than that of silicon may cause a crystal defect. The wide bandgap semiconductor is defined as, for example, a semiconductor having a bandgap approximately twice the bandgap (1.12 eV) of silicon.

Embodiments can be freely combined, and appropriately modified or omitted within the scope of the invention. Although this invention has been described in detail, the description is in all aspects illustrative and does not restrict the invention. Numerous modifications that have yet been exemplified will be devised without departing from the scope of the invention.

EXPLANATION OF REFERENCE SIGNS

R1 active region, R2 terminal region, 10 substrate (semiconductor substrate), 20 drift layer, 21-24 spaced-apart region, 30 well region (first well region), 31 well region (second well region), 31*a*, 31*b* well region, 35, 36 high-concentration region, 40 source region, 50 gate insulating film, 52 field insulating film, 55 interlayer insulating film, 60 gate electrode portion, 70 ohmic contact part, 71 ohmic contact part (first ohmic contact part), 72 ohmic contact part (second ohmic contact part), 75 Schottky electrode, 79 ohmic electrode, 80 source electrode (first electrode), 80*w*, 81*w*, 82*w* wiring layer, 81 test electrode (second electrode), 81M probe trace, 81P electrode pad, 82 gate electrode, 85 drain electrode, 89 wiring part, 90-92, 95 contact hole, 101-106, 106*a*-106*c* MOSFET (semiconductor device).

The invention claimed is:

1. A semiconductor device, comprising:
   a semiconductor substrate having a first conductivity type;
   a drift layer having said first conductivity type, said drift layer being formed on said semiconductor substrate and made of a wide bandgap semiconductor;
   a plurality of first well regions being formed on said drift layer and having a second conductivity type different from said first conductivity type;
   a source region being separated from said drift layer by one of said plurality of first well regions and having said first conductivity type, said source region being formed on each of said plurality of first well regions;
   a gate insulating film formed on each of said plurality of first well regions;
   a gate electrode formed above said gate insulating film;
   a first electrode being ohmic-connected to said source regions, and having diode characteristics allowing unipolar conduction to said drift layer through a spaced-apart region between adjacent first well regions of said plurality of first well regions, said spaced-apart region having said first conductivity type;
   at least one second well region being formed on said drift layer to be separated from said plurality of first well regions, and having said second conductivity type, said gate electrode being arranged above said at least one second well region;
   a second electrode being ohmic-connected to said at least one second well region and not in direct contact with any semiconductor region having said first conductivity type, insulated from said gate electrode, and separated from said first electrode, said second electrode being large enough to place a probe needle; and
   a third electrode electrically connected to said semiconductor substrate,
   wherein said gate electrode includes an electrode portion and a wiring layer that has a resistivity lower than a resistivity of said electrode portion, and
   said wiring layer is vertically above a part of said at least one second well.

2. The semiconductor device according to claim 1, wherein said second electrode includes an electrode pad.

3. The semiconductor device according to claim 2, wherein said electrode pad has a probe trace.

4. The semiconductor device according to claim 1, further comprising
   a wiring part that electrically short-circuits said first electrode and said second electrode, said wiring part being disposed above said first electrode and said second electrode.

5. The semiconductor device according to claim 1, wherein said first electrode includes a first ohmic contact part that is ohmic-connected to said at least one second well region, and
   said second electrode includes a second ohmic contact part that is ohmic-connected to said at least one second well region.

6. The semiconductor device according to claim 5, further comprising
   a field insulating film being formed on said at least one second well region, said field insulating film being thicker than said gate insulating film,
   wherein at least one of said first ohmic contact part and said second ohmic contact part is disposed in a contact hole provided in said field insulating film.

7. The semiconductor device according to claim 5, wherein said at least one second well region includes a plurality of second well regions formed to be separated from each other, and among said plurality of second well regions, a second well region that is ohmic-connected to said first ohmic contact part is different from a second well region that is ohmic-connected to said second ohmic contact part.

8. The semiconductor device according to claim 5, wherein said at least one second well region includes one well region having a first plane that is ohmic-connected to said first ohmic contact part, and a second plane that is ohmic-connected to said second ohmic contact part, said one well region having a third plane that separates said first plane and said second plane, said third plane having a sheet resistance higher than a sheet resistance of each of said first plane and said second plane.

9. The semiconductor device according to claim 1, wherein said gate electrode includes a gate electrode portion on said gate insulating film, and a wiring layer that is in contact with said gate electrode portion, and said second electrode is positioned between said first electrode and said wiring layer in a plan view.

10. The semiconductor device according to claim 1, wherein said gate electrode includes a gate electrode portion on said gate insulating film, and a wiring layer that is in contact with said gate electrode portion, and said wiring layer is positioned between said first electrode and said second electrode in a plan view.

11. The semiconductor device according to claim 1, wherein said wide bandgap semiconductor is silicon carbide.

12. The semiconductor device according to claim 1, wherein said first electrode includes a Schottky electrode that is in contact with said drift layer between adjacent first well regions of said plurality of first well regions.

13. A method for manufacturing a semiconductor device, comprising:
forming
a semiconductor substrate having a first conductivity type,
a drift layer having said first conductivity type, said drift layer being formed on said semiconductor substrate and made of a wide bandgap semiconductor,
a plurality of first well regions being formed on said drift layer and having a second conductivity type different from said first conductivity type,
a source region being separated from said drift layer by one of said plurality of first well regions and having said first conductivity type, said source region being formed on each of said plurality of first well regions,
a gate insulating film formed on each of said plurality of first well regions,
a gate electrode formed above said gate insulating film,
a first electrode being in contact with said source regions, and having diode characteristics allowing unipolar conduction to said drift layer through a spaced-apart region between adjacent first well regions of said plurality of first well regions, said spaced-apart region having said first conductivity type,
at least one second well region being formed on said drift layer to be separated from said plurality of first well regions, and having said second conductivity type, said gate electrode being arranged above said at least one second well region,
a second electrode being in contact with said at least one second well region and not in direct contact with any semiconductor region having said first conductivity type, insulated from said gate electrode, and separated from said first electrode, and
a third electrode electrically connected to said semiconductor substrate; and
forward biasing a p-n junction between said at least one second well region and said drift layer with application of a voltage between said second electrode and said third electrode, said voltage being lower than a voltage between said first electrode and said third electrode,
wherein said gate electrode includes an electrode portion and a wiring layer that has a resistivity lower than a resistivity of said electrode portion, and
said wiring layer is vertically above a part of said at least one second well.

14. The method according to claim 13, further comprising short-circuiting said first electrode and said second electrode after said forward biasing.

* * * * *